US009488345B2

(12) United States Patent
Abe et al.

(10) Patent No.: US 9,488,345 B2
(45) Date of Patent: Nov. 8, 2016

(54) LIGHT EMITTING DEVICE, ILLUMINATION APPARATUS INCLUDING THE SAME, AND MOUNTING SUBSTRATE

(71) Applicant: PANASONIC INTELLECTUAL PROPERTY MANAGEMENT CO., LTD., Osaka (JP)

(72) Inventors: Masumi Abe, Osaka (JP); Toshifumi Ogata, Osaka (JP); Atsuyoshi Ishimori, Osaka (JP); Kenji Sugiura, Osaka (JP); Yasufumi Wada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 83 days.

(21) Appl. No.: 14/574,952

(22) Filed: Dec. 18, 2014

(65) Prior Publication Data

US 2015/0176820 A1     Jun. 25, 2015

(30) Foreign Application Priority Data

Dec. 20, 2013    (JP) ................. 2013-264558

(51) Int. Cl.
*F21V 19/00* (2006.01)
*F21V 9/08* (2006.01)
*H01L 25/075* (2006.01)
*H01L 33/62* (2010.01)
*H05K 1/02* (2006.01)
*H05K 3/22* (2006.01)
*H05K 3/28* (2006.01)

(52) U.S. Cl.
CPC ............. *F21V 19/0025* (2013.01); *F21V 9/08* (2013.01); *F21V 19/002* (2013.01); *H01L 25/0753* (2013.01); *H05K 1/029* (2013.01); *H01L 33/62* (2013.01); *H01L 2224/45144* (2013.01); *H01L 2224/48137* (2013.01); *H01L 2224/49107* (2013.01); *H01L 2224/73265* (2013.01); *H01L 2924/181* (2013.01); *H05K 1/0274* (2013.01); *H05K 3/222* (2013.01); *H05K 3/284* (2013.01); *H05K 2201/10106* (2013.01); *H05K 2201/10287* (2013.01); *H05K 2201/2054* (2013.01)

(58) Field of Classification Search
CPC .... F21V 19/0025; F21V 19/002; F21V 9/08; F21V 19/00; F21Y 2101/02; H05K 1/029; H05K 1/0274; H05K 3/222; H05K 3/284; H05K 2201/10106; H05K 2201/10287; H05K 2201/2054; H01L 2224/45144; H01L 33/62; H01L 2224/73265; H01L 25/0753; H01L 2224/49107; H01L 2224/48137; H01L 2924/181

See application file for complete search history.

(56) References Cited

U.S. PATENT DOCUMENTS

| 6,540,373 | B2 * | 4/2003 | Bailey ................. E04B 9/32 362/147 |
| 8,124,429 | B2 * | 2/2012 | Norman .............. H01L 23/50 257/E21.526 |
| 8,890,186 | B2 * | 11/2014 | Ogata ................ B29C 33/0016 257/100 |
| 2014/0340890 | A1 * | 11/2014 | Hata .................... A01G 7/045 362/231 |
| 2015/0016109 | A1 | 1/2015 | Ogata et al. |

FOREIGN PATENT DOCUMENTS

JP      2011-210621      10/2011

OTHER PUBLICATIONS

U.S. Appl. No. 14/508,140 to Masumi Abe et al., which was filed on Oct. 7, 2014.

* cited by examiner

*Primary Examiner* — Bao Q Truong
(74) *Attorney, Agent, or Firm* — Greenblum & Bernstein, P.L.C.

(57) ABSTRACT

A light emitting device includes: a substrate; a plurality of light emitting elements mounted in a light emitting area of the substrate, and an intermediate line for electrically connecting a plurality of light emitting elements in parallel or series selectively, the intermediate line being disposed in the light emitting area.

15 Claims, 17 Drawing Sheets

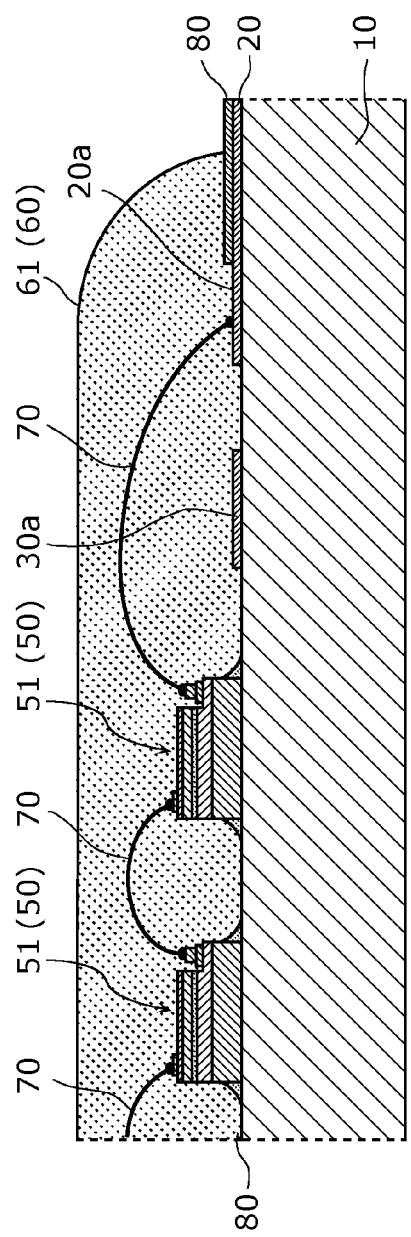
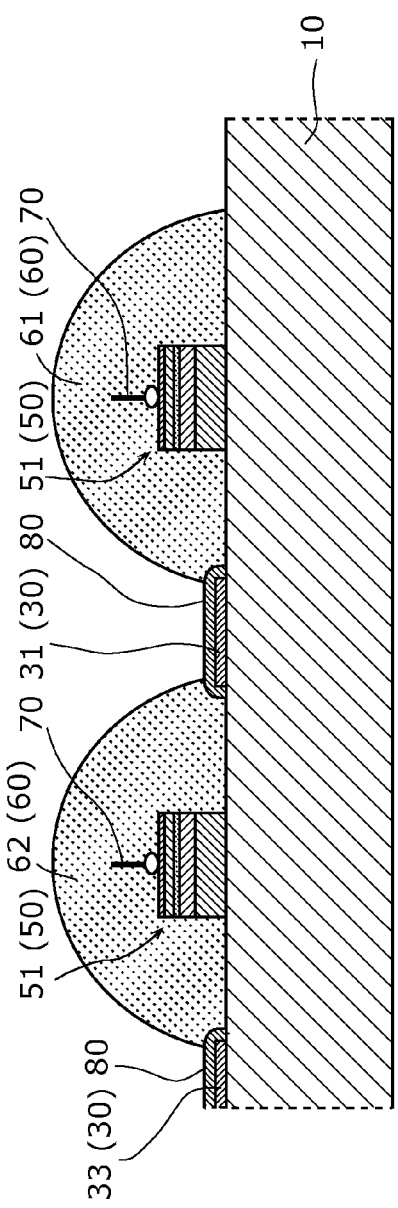
FIG. 3A
FIG. 3B

LIGHT EMITTING DEVICE, ILLUMINATION APPARATUS INCLUDING THE SAME, AND MOUNTING SUBSTRATE

BACKGROUND OF THE INVENTION

1. Field of the Invention

The present disclosure relates to a light emitting device, an illumination apparatus including the same, and a mounting substrate.

2. Description of the Related Art

Semiconductor light emitting elements such as light emitting diodes (LEDs) are widely used as highly efficient, small light sources in various apparatuses for illumination and display, for instance.

For example, as disclosed in Japanese Unexamined Patent Application Publication No. 2011-210621, LEDs are used in, for instance, illumination apparatuses which are substitutes for existing lamps such as incandescent bulbs and fluorescent lights, and recessed lighting fixtures such as downlights and spotlights which are installed in the ceiling and emit light downward.

LEDs are each achieved as an LED module (light emitting device) which is a single unit, and are included in various devices. Such LED modules include a light emitting device having a COB (chip on board) structure in which a plurality of LED chips are directly mounted on a substrate. Another LED module is a light emitting device having an SMD (surface mount device) structure in which separately packaged SMD LED elements are mounted on a substrate.

SUMMARY OF THE INVENTION

A light emitting device according to various exemplary embodiments includes: a substrate; a plurality of light emitting elements mounted in a light emitting area of the substrate; and an intermediate line for electrically connecting the plurality of light emitting elements in parallel or series selectively. The intermediate line is disposed in the light emitting area.

The above configuration allows making a selection when a light emitting device is fabricated using the same substrate as to whether groups of light emitting elements are connected in series and/or parallel.

BRIEF DESCRIPTION OF DRAWINGS

FIG. 3A is a cross-sectional view of the light emitting device according to the first exemplary embodiment taken along 3A-3A in FIG. 2A;

FIG. 3B is a cross-sectional view of the light emitting device according to the first exemplary embodiment taken along 3B-3B in FIG. 2A;

DETAILED DESCRIPTION OF THE PREFERRED EMBODIMENTS

Prior to a description of exemplary embodiments, a description is given of problems that light emitting devices according to related techniques have. There are demands for light emitting devices to be compliant with various specifications such as a substrate size, a line pattern, and disposition and connection of LEDs (series/parallel connection), according to a destination (such as a foreign country), usage, regulation, standard, and others. If substrates, which are components included in light emitting devices, are manufactured in wide varieties in small amounts, the price of a substrate among all the components of a light emitting device increases, which raises the price of the light emitting device, accordingly.

For example, it is possible to increase the size of a substrate in order to increase the flexibility of disposition of LEDs and line pattern layout. However, there has been a demand for a smaller light emitting device, and thus the size of a substrate cannot be simply increased.

The following describes exemplary embodiments, with reference to the drawings. Each of the exemplary embodiments described below shows a preferred example. Thus, the numerical values, shapes, materials, constituent elements, the disposition and connection of the constituent elements, steps, the processing order of the steps, and others described in the following exemplary embodiments are mere examples, and do not intend to limit the present disclosure. It should be noted that the drawings are schematic diagrams, and do not necessarily provide strictly accurate illustration. Furthermore, the same numerals are given to substantially the same constituent elements in the diagrams, and thus a redundant description is omitted or simplified.

First Exemplary Embodiment

Figure 1:
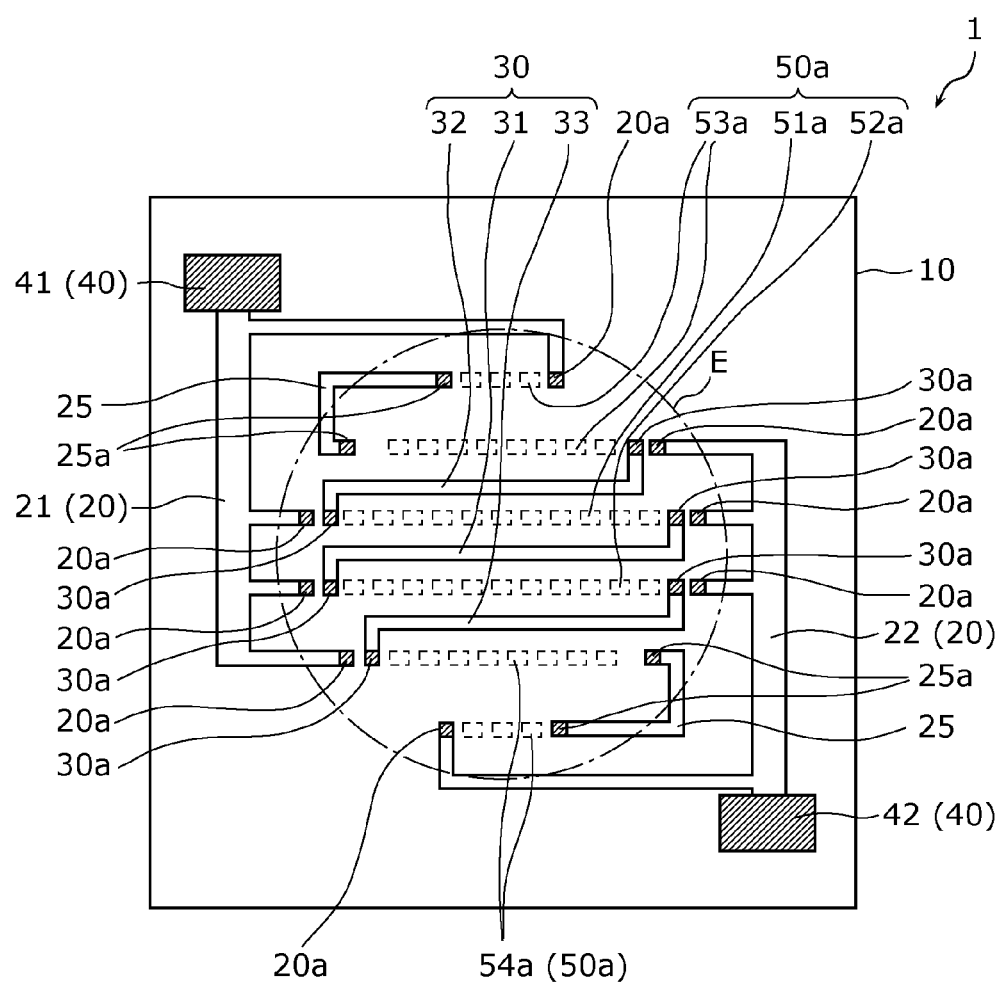
FIG. 1 is a plan view of a mounting substrate according to a first exemplary embodiment.
Figure 2A:
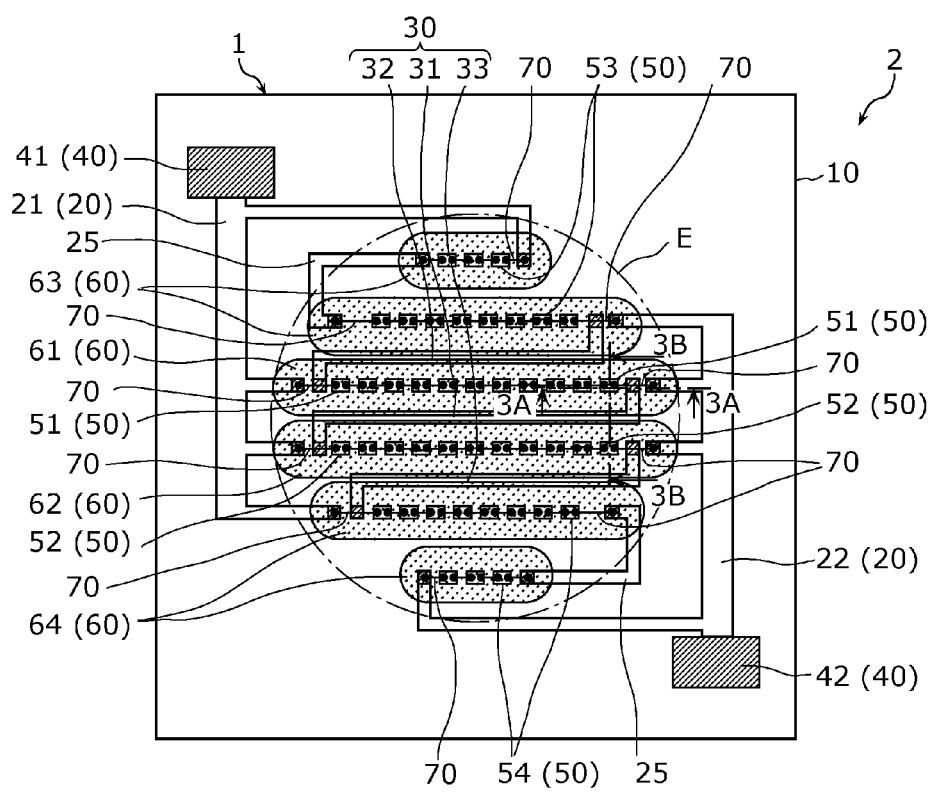
FIG. 2A is a plan view of a light emitting device according to the first exemplary embodiment when 4 parallel strings of 11 LEDs in series (11S4P) are connected to the mounting substrate in FIG. 1.
Figure 2B:
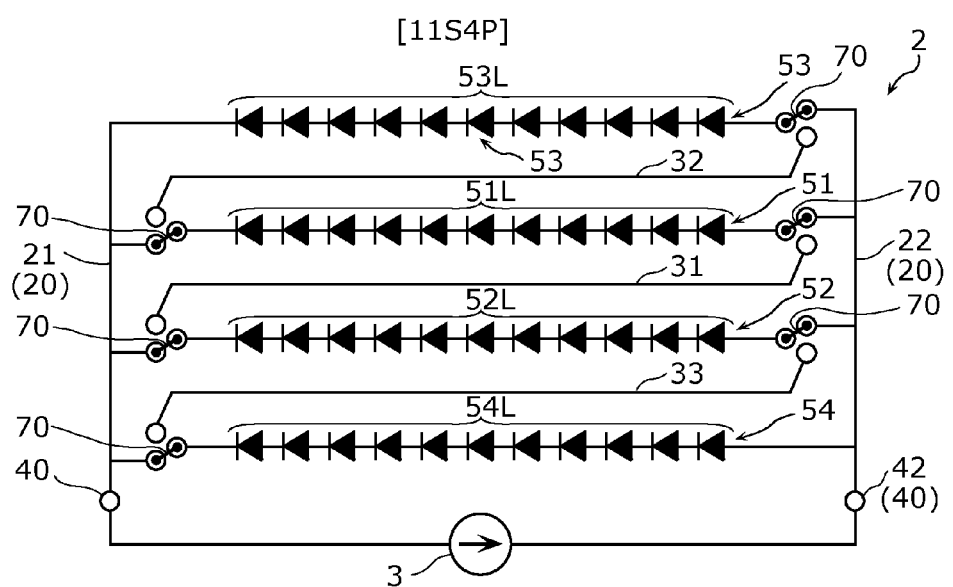
FIG. 2B is an electric diagram of the light emitting device according to the first exemplary embodiment when 4 parallel strings of 11 LEDs in series (11S4P) are connected to the mounting substrate in FIG. 1.

First is a description of mounting substrate 1 and light emitting device 2 according to a first exemplary embodiment, with reference to FIGS. 1, 2A, 2B, 3A, and 3B. FIG. 1 is a plan view of mounting substrate 1. FIGS. 2A and 2B are respectively a plan view and an electric diagram of light emitting device 2 which includes 4 parallel strings of 11 LEDs in series. FIG. 3A is a cross-sectional view taken along 3A-3A in FIG. 2A. FIG. 3B is a cross-sectional view taken along 3B-3B in FIG. 2A.

As illustrated in FIG. 1, a plurality of LEDs (not illustrated) can be mounted in predetermined light emitting area E of mounting substrate 1. Mounting substrate 1 includes substrate 10, supply lines 20, and intermediate lines 30. Mounting substrate 1 further includes relay lines 25 and supply terminals 40.

Light-emitting area E is a preset area of substrate 10 which is a light emitting portion of light emitting device 2. Sealing members are disposed in light emitting area E where LEDs are mounted. Although light emitting area E (area surrounded by a dashed dotted line in FIG. 1) is a circle as illustrated in FIG. 1, the shape thereof is not limited to this. Light-emitting area E may be in a different shape such as a rectangle, for example. The shape of light emitting area E in light emitting device 2 is a circle having a diameter of 12 mm, for example.

LED mounting positions 50a set in light emitting area E are positions where LEDs are mounted. For example, LED mounting positions 50a are set to form plural lines. As illustrated in FIG. 1, 44 LED mounting position 50a are set. Specifically, first mounting position 51a, second mounting position 52a, third mounting position 53a, and fourth mounting position 54a are set. Eleven first LEDs 51 (FIG. 2A) are mounted at first mounting position 51a. Eleven second LEDs 52 (FIG. 2A) are mounted at second mounting position 52a. Eleven third LEDs 53 (FIG. 2A) are mounted at third mounting position 53a. Eleven fourth LEDs 54 (FIG. 2A) are mounted at fourth mounting position 54a.

As illustrated in FIG. 2A, light emitting device 2 is an LED module achieved using a plurality of LEDs 50, which includes substrate 10, supply lines 20, intermediate lines 30, and LEDs 50. Light-emitting device 2 further includes relay lines 25, supply terminals 40, sealing members 60, and wires 70. In other words, light emitting device 2 is configured to include LEDs 50, sealing members 60, and wires 70 above mounting substrate 1 in FIG. 1.

Furthermore, light-emitting device 2 is an LED module having a COB structure in which bare chips that are LEDs 50 are directly mounted on substrate 10. The following describes in detail mounting substrate 1 and constituting members of light emitting device 2.

[Substrate]

LEDs 50 (first LEDs 51, second LEDs 52, third LEDs 53, and fourth LEDs 54) are mounted on substrate 10. A ceramic substrate, a resin substrate, a metal base substrate, or a glass substrate, for instance, can be used as substrate 10.

An alumina substrate or an aluminum nitride substrate, for instance, can be used as a ceramic substrate. For example, a glass epoxy substrate or a flexible substrate having elasticity, for instance, can be used as a resin substrate. For example, an aluminum alloy substrate, a ferroalloy substrate, or a copper alloy substrate, for instance, having an insulating film formed on the surface can be used as a metal base substrate.

A white substrate having high optical reflectance (90% or more, for example) may be used as substrate 10. Using a white substrate allows light from LEDs 50 to be reflected off the surface of substrate 10, thus improving light extraction efficiency of light emitting device 2.

A ceramic substrate is used as substrate 10. Compared with a resin substrate, a ceramic substrate has high thermal conductivity, and can efficiently dissipate heat from LEDs 50. Furthermore, a ceramic substrate shows little time degradation, and has excellent heat resistance.

More specifically, a white polycrystalline alumina substrate (polycrystal ceramic substrate) obtained by sintering alumina particles, which has a thickness of about 1 mm, for example, can be used as substrate 10.

Furthermore, a rectangular substrate can be used as substrate 10, as an example. One side of substrate 10 may have a length of 10 mm to 100 mm, for example. Substrate 10 is a square with sides having a length of 20 mm, for example.

It should be noted that the shape of substrate 10 is not limited to a rectangle. The shape of substrate 10 may be a circle, a polygon having five or more angles, a triangle, an oval, or a different shape. Furthermore, a long rectangular substrate may be used.

[LEDs]

In light emitting device 2, LEDs (light emitting elements) 50 are mounted in predetermined light emitting area E of substrate 10, as illustrated in FIG. 2A. LEDs 50 are mounted at LED mounting positions 50a (see FIG. 1). 44 LEDs 50 are mounted on substrate 10. LEDs 50 can be mounted at intervals of 0.7 mm to 3.0 mm, for example.

LEDs 50 include first LEDs (first light emitting elements) 51 connected in series, and second LEDs (second light emitting elements) 52 connected in series. As illustrated in FIG. 2A, LEDs 50 further include third LEDs (third light emitting elements) 53 connected in series, and fourth LEDs (fourth light emitting elements) 54 connected in series.

In other words, LEDs 50 include series connected bodies (groups of series LED elements), as illustrated in FIGS. 2A and 2B. First series connected body 51L includes first LEDs 51 connected in series. Second series connected body 52L includes second LEDs 52 connected in series. Third series connected body 53L includes third LEDs 53 connected in series. Fourth series connected body 54L includes fourth LEDs 54 connected in series. Eleven first LEDs 51, eleven second LEDs 52, eleven third LEDs 53, and eleven fourth LEDs 54 are included in respective series connected bodies.

Furthermore, at least two of LEDs 50 connected in series in each of the series connected bodies may be linearly disposed to form an element string.

All first LEDs 51 in first series connected body 51L are linearly disposed to form a single first element string, as illustrated in FIG. 2A. Similarly, all second LEDs 52 in second series connected body 52L are linearly disposed as a single second element string.

In contrast, third LEDs 53 in third series connected body 53L are divided into two third element strings (eight LEDs and three LEDs), and are disposed linearly in the element strings. Similarly, fourth LEDs 54 in fourth series connected body 54L are divided into two fourth element strings (eight LEDs and three LEDs), and disposed linearly in the element strings.

As described above, two series connected bodies among four series connected bodies are each divided into two element strings. Two relay lines 25 are formed in order to connect the divided element strings.

Furthermore, two adjacent LEDs 50 are directly connected via wire 70. Thus, adjacent LEDs 50 are wire-bonded by chip-to-chip connection. Specifically, two adjacent first LEDs 51, two adjacent second LEDs 52, two adjacent third LEDs 53, and two adjacent fourth LEDs 54 are connected via wires 70. Chip-to-chip connection allows LEDs 50 to be mounted in high density with ease. Accordingly, chip-to-chip connection is suitable for decreasing the size of light emitting device 2.

It should be noted that how LEDs 50 are connected is not limited to chip-to-chip connection. For example, a conductive land (line) may be provided in each space between adjacent LEDs 50, and such lands and LEDs 50 may be wire-bonded one by one.

LEDs 50 (first LEDs 51, second LEDs 52, third LEDs 53, and fourth LEDs 54) are examples of semiconductor light emitting elements, and emit light using certain power. LEDs 50 are bare chips which emit single-color visible light. For example, blue LED chips which emit blue light when in a conductive state are used as LEDs 50. For example, a gallium nitride based semiconductor light emitting element whose central wavelength is 440 nm to 470 nm can be used as a blue LED chip. More specifically, LED 50 which is a blue LED chip includes a sapphire substrate, a plurality of nitride semiconductor layers stacked above the sapphire substrate, and an anode electrode (not illustrated) and a cathode electrode (not illustrated) disposed above the top surface of the nitride semiconductor layers.

Furthermore, in each of the element strings, LEDs 50 are disposed in the same orientation in top view. In other words, LEDs 50 are disposed such that anode and cathode electrodes are located alternately in each of the element strings.

Furthermore, LEDs 50 are disposed in the same orientation in the element strings. Specifically, in the first element string (eleven first LEDs 51), the second element string (eleven second LEDs 52), the third element string (eight third LEDs 53), and the fourth element string (eight fourth LEDs 54), all LEDs 50 are disposed in the same orientation in top view.

LEDs 50 disposed in such a manner are electrically connected by intermediate lines 30 and wires 70 so as to be connected in series or parallel, or connected in both series and parallel.

LEDs 50 are connected in parallel or series in units of series connected bodies. Specifically, first series connected body 51L, second series connected body 52L, third series connected body 53L, and fourth series connected body 54L are connected in parallel or series.

It should be noted that the same Vf (forward voltage), for example, is applied to LEDs 50 on substrate 10. However, Vf for individual LEDs 50 may vary in a predetermined range. Variations of the sum total of voltages Vf (total Vf) applied to all LEDs 50 connected in series in each of the series connected bodies may fall within a predetermined amount. Specifically, total voltages Vf for first series connected body 51L, second series connected body 52L, third series connected body 53L, and fourth series connected body 54L may have substantially the same values which show a predetermined variation at most.

[Supply Lines, Relay Lines]

Supply lines 20 supply, to LEDs 50 mounted on substrate 10, power for causing LEDs 50 to emit light. Supply lines 20 include first supply line 21 and second supply line 22 disposed in an electrically separated manner.

Relay lines 25 relay power from one of two adjacent LEDs 50 in the same series connected body to the other. Relay lines 25 are formed separately from supply lines 20.

Supply lines 20 (first supply line 21 and second supply line 22) and relay lines 25 are metal lines which include a metal material such as, for example, silver, copper, or gold, and are formed above substrate 10 in predetermined shapes. It should be noted that metal lines obtained by performing gold-plating processing on silver which is base metal can also be used as supply lines 20 and relay lines 25. Supply lines 20 and relay lines 25 are formed using the same material, and simultaneously formed in a pattern in the same step.

Supply lines 20 have the upper and lateral surfaces covered with insulating film 80. Similarly, relay lines 25 are also covered with insulating film 80. For example, a glass film (glass coat film), an insulating resin film (resin coating film), or the like can be used as insulating film 80. A white resist film having high reflectance of about 98% can be used as an insulating resin film. Covering supply lines 20 and relay lines 25 with insulating film 80 achieves an improvement in insulating properties (dielectric strength voltage) of substrate 10, and also can inhibit metal oxidation of supply line 20 and relay line 25.

It should be noted that as illustrated in FIGS. 3A and 3B, insulating film 80 is formed only on the upper and lateral surfaces of lines (supply lines 20, relay lines 25, and intermediate lines 30), except for portions where wires 70 are connected (connection pads). Insulating film 80 is not formed on the surface of substrate 10.

In addition, end portions of supply lines 20 are electrically connected to supply terminals 40. Specifically, an end portion of first supply line 21 is connected to first supply terminal 41, and an end portion of second supply line 22 is connected to second supply terminal 42.

On the other hand, other end portions of supply lines 20 are electrically connected to LEDs 50 (first LEDs 51, second LEDs 52, third LEDs 53, and fourth LEDs 54). In this manner, certain current is supplied to LEDs 50 via supply lines 20.

First supply line 21 and second supply line 22 each have four branches extending toward first series connected body 51L (first LEDs 51), second series connected body 52L (second LEDs 52), third series connected body 53L (third LEDs 53), and fourth series connected body 54L (fourth LEDs 54). The other four end portions of each of first supply line 21 and second supply line 22 can be connected to, via wires 70, LEDs 50 of first series connected body 51L, second series connected body 52L, third series connected body 53L, and fourth series connected body 54L. In other words, LEDs 50 of the series connected bodies are disposed near the other four end portions of each of first supply line 21 and second supply line 22, so as to be wire-bonded to the other four end portions of the lines.

The other four end portions of each of first supply line 21 and second supply line 22 include connection pads (second connection pads) 20a to which wires 70 are connected.

Two relay lines 25 are disposed. One of relay lines 25 connects in series the third element string which includes eight third LEDs 53 and the third element string which includes three third LEDs 53 of third series connected body 53L. The other of relay lines 25 connects in series the fourth element string which includes eight fourth LEDs 54 and the fourth element string which includes three fourth LEDs 54 of fourth series connected body 54L. In addition, both end portions of each of relay lines 25 include connection pads (third connection pads) 25a to which wires 70 are connected.

At connection pads 20a of supply lines 20, conductive portions (metal) of supply lines 20 are exposed (shaded portions in FIG. 1). Similarly, at connection pads 25a of relay lines 25, conductive portions (metal) of relay lines 25 are exposed (shaded portions in FIG. 1). In other words, insulating film 80 is not formed on connection pads 20a of supply lines 20 and connection pads 25a of relay lines 25. Openings of insulating film 80 are formed at connection pads 20a and 25a.

[Intermediate Lines]

Intermediate line 30 electrically connects LEDs 50 in parallel or series selectively. Accordingly, intermediate lines 30 are lines for selecting series or parallel connection. The same metal material as that of supply lines 20 and relay lines 25 can be used for intermediate lines 30. Intermediate lines 30 are made of the same material as that of supply lines 20 and relay lines 25, and formed in a pattern simultaneously at the same step as that for supply lines 20 and relay lines 25. Intermediate lines 30 are disposed separately from supply lines 20 and relay lines 25.

As illustrated in FIG. 1, intermediate lines 30 are disposed in predetermined light emitting area E. In other words, intermediate lines 30 are disposed inside light emitting area E, not outside light emitting area E.

Intermediate lines 30 include three lines, namely, first intermediate line 31, second intermediate line 32, and third intermediate line 33. First intermediate line 31, second intermediate line 32, and third intermediate line 33 are disposed electrically separately from one another.

An end portion of intermediate line 30 can be connected to LED 50 at the leading or tail end of an element string (series connected body). The other end portion of intermediate line 30 can be connected to LED 50 at the leading or tail end of another element string.

For example, a leading end and a tail end of a series connected body which represents electrically connected LEDs 50 in FIGS. 1, 2A, and 2B are defined as follows. Among LEDs 50 in each of the series connected bodies, LED 50 connected to first supply line 21 is assumed to be at the leading end. Among LEDs 50 in each of the series connected bodies, LED 50 connected to second supply line 22 is assumed to be at the tail end. It should be noted that first supply terminal 41 is a lower-voltage (minus) electrode terminal, whereas second supply terminal 42 is a higher-voltage (plus) electrode terminal. Thus, a cathode electrode of LED 50 is at the leading end, whereas an anode electrode of LED 50 is at the tail end. Furthermore, in element strings showing physical disposition of LEDs 50 in FIG. 2B, leftmost LED 50 is assumed to be at the leading end, and rightmost LED 50 is assumed to be at the tail end.

In this case, an end portion (left end portion) of first intermediate line 31 can be connected to second LED 52 at the leading end of the second element string (second series connected body 52L) via wire 70. In addition, the other end portion (right end portion) of first intermediate line 31 can be connected to first LED 51 at the tail end of the first element string (first series connected body 51L) via wire 70. In the case of 4 parallel strings of 11 LEDs in series, as illustrated in FIG. 2B, the end portion (left end portion) and the other end portion (right end portion) of first intermediate line 31 are not connected to any of LEDs 50, and thus are floating electrically. In other words, no current flows through first intermediate line 31.

Similarly, an end portion (left end portion) of second intermediate line 32 can be connected to first LED 51 at the leading end of the first element string (first series connected body 51L) via wire 70. In addition, the other end portion (right end portion) of second intermediate line 32 can be connected to third LED 53 at the tail end of the third element string (third series connected body 53L) via wire 70. In the case of 4 parallel strings of 11 LEDs in series, as illustrated in FIG. 2B, the end portion (left end portion) and the other end portion (right end portion) of second intermediate line 32 are not connected to any of LEDs 50, and thus are floating electrically. In other words, no current flows through second intermediate line 32, either.

Similarly, an end portion (left end portion) of third intermediate line 33 can be connected to fourth LED 54 at the leading end of the fourth element string (fourth series connected body 54L) via wire 70. In addition, the other end portion (right end portion) of third intermediate line 33 can be connected to second LED 52 at the tail end of the second element string (second series connected body 52L) via wire 70. In the case of 4 parallel strings of 11 LEDs in series, as illustrated in FIG. 2B, the end portion (left end portion) and the other end portion (right end portion) of third intermediate line 33 are not connected to any of LEDs 50, and thus are floating electrically. In other words, no current flows through third intermediate line 33, either.

Intermediate lines 30 have straight portions linearly disposed between element strings of LEDs 50. Specifically, as illustrated in FIG. 2A, first intermediate line 31 has a first straight portion linearly disposed between the first element string which includes first LEDs 51 and the second element string which includes second LEDs 52. Similarly, second intermediate line 32 has a second straight portion linearly disposed between the first element string which includes first LEDs 51 and the third element string which includes third LEDs 53. Third intermediate line 33 has a third straight portion linearly disposed between the second element string which includes second LEDs 52 and the fourth element string which includes fourth LEDs 54.

The straight portions (first straight portion, second straight portion, and third straight portion) of intermediate lines 30 are disposed in parallel to the element strings. In other words, the straight portions extend in the direction in which the element strings are disposed.

The straight portions of intermediate lines 30 are each disposed between adjacent element strings (series connected bodies). Specifically, the first straight portion of first intermediate line 31 is disposed between the first element string (first series connected body 51L) and the second element string (second series connected body 52L). The second straight portion of second intermediate line 32 is disposed between the first element string (first series connected body 51L) and the third element string (third series connected body 53L). The third straight portion of third intermediate line 33 is disposed between the second element string (second series connected body 52L) and the fourth element string (fourth series connected body 54L).

The straight portions (the first straight portion, the second straight portion, and the third straight portion) of intermediate lines 30 are covered with insulating film 80. As illustrated in FIG. 3B, the upper and lateral surfaces of intermediate lines 30 are covered with insulating film 80, except for connection pads at both ends. Intermediate lines 30 are covered with insulating film 80, which improves insulating properties (dielectric strength voltage) of substrate 10 and also inhibits metal oxidation and optical absorption of intermediate lines 30.

Both end portions of intermediate lines 30 each include a connection pad (first connection pad) 30a. Wire 70 is connected to connection pad 30a. Conductive portions (metal) of intermediate lines 30 are exposed at connection pads 30a. Connection pads 30a are the shaded portions in FIG. 1. In other words, insulating film 80 is not formed on connection pads 30a of intermediate lines 30. Thus, insulating film 80 has openings at connection pads 30a.

Connection pads 30a at the end portions of intermediate lines 30 are each disposed between connection pad 20a of supply line 20 and LED 50 at the leading or tail end of an element string (series connected body). Connection pad 30a of intermediate line 30, connection pad 20a of supply line 20, and LEDs 50 may be disposed linearly. In this manner, when sealing member 60 is formed using a dispenser, connection pads 20a, connection pads 30a, and LEDs 50 can be collectively sealed by merely moving a dispenser nozzle or substrate 10 linearly.

Specifically, as illustrated in FIGS. 1, 2A, and 2B, connection pad 30a at the end portion (left end portion) of first intermediate line 31 is disposed between connection pad 20a of first supply line 21 and second LED 52 at the leading end of the second element string (second series connected body 52L). On the other hand, connection pad 30a at the other end portion (right end portion) of first intermediate line 31 is disposed between connection pad 20a of second supply line 22 and first LED 51 at the tail end of the first element string (first series connected body 51L).

Similarly, connection pad 30a at the end portion (left end portion) of second intermediate line 32 is disposed between connection pad 20a of first supply line 21 and first LED 51 at the lading end of the first element string (first series connected body 51L). On the other hand, connection pad 30a at the other end portion (right end portion) of second intermediate line 32 is disposed between connection pad 20a of second supply line 22 and third LED 53 at the tail end of the third element string (third series connected body 53L).

Similarly, connection pad 30a at the end portion (left end portion) of third intermediate line 33 is disposed between connection pad 20a of first supply line 21 and fourth LED 54 at the leading end of the fourth element string (fourth series connected body 54L). On the other hand, connection pad 30a at the other end portion (right end portion) of third intermediate line 33 is disposed between connection pad 20a of second supply line 22 and second LED 52 at the tail end of the second element string (second series connected body 52L).

[Supply Terminals]

Substrate 10 includes a pair of supply terminals 40. Supply terminals 40 in the pair are external connection terminals (electrode terminals) for receiving certain power from outside of light emitting device 2 (external power supply), for instance. Supply terminals 40 in the pair receive direct current power for causing LEDs 50 to emit light, and supply the received direct current power to LEDs 50 on substrate 10 via supply lines 20, relay lines 25, and intermediate lines 30.

As illustrated in FIG. 2B, light emitting device 2 is connected to single power supply 3. In other words, common power supply 3 provides power, via supply terminals 40 in the pair, to LEDs 50 of first series connected body 51L (first LEDs 51), second series connected body 52L (second LEDs 52), third series connected body 53L (third LEDs 53), and fourth series connected body 54L (fourth LEDs 54).

In addition, one of supply terminals 40 in the pair is first supply terminal 41, and is a lower-voltage (minus) connection terminal, for example. On the other hand, the other of supply terminals 40 in the pair is second supply terminal 42, and is a higher-voltage (plus) connection terminal, for example.

As illustrated in FIG. 1, first supply terminal 41 and second supply terminal 42 are metal electrodes (metal terminals) made of, for instance, gold formed in a rectangular pattern, for example. In other words, conductive portions (metal) of first supply terminal 41 and second supply terminal 42 are exposed (shaded portions in FIG. 1). First supply terminal 41 and second supply terminal 42 are not covered with insulating film 80.

It should be noted that first supply terminal 41 and second supply terminal 42 may be formed like sockets. In this case, first supply terminal 41 and second supply terminal 42 each include a resin socket and a conductive portion for receiving direct current power (current-carrying pin). The conductive portions are electrically connected to supply lines 20 disposed above substrate 10.

[Sealing Members]

As illustrated in FIG. 2A, sealing members 60 are disposed above substrate 10 so as to cover LEDs 50. Sealing members 60 seal LEDs 50, thus giving protection to LEDs 50. Sealing members 60 are disposed in predetermined light emitting area E.

Sealing members 60 are each disposed linearly so as to seal one string of LEDs 50 collectively, among LEDs 50 in the element strings. In other words, sealing members 60 are linearly disposed in a direction (disposition direction) in which LEDs 50 are disposed, so as to cover all LEDs 50 in the element strings.

Sealing members 60 include first sealing member 61, second sealing member 62, third sealing member 63, and fourth sealing member 64.

First sealing member 61 is linearly disposed so as to seal all first LEDs 51 in first series connected body 51L (first element string) collectively. Second sealing member 62 is linearly disposed so as to seal all second LEDs 52 in second series connected body 52L (second element string) collectively.

Third sealing member 63 is linearly disposed so as to seal third LEDs 53 in third series connected body 53L collectively. Fourth sealing member 64 is linearly disposed so as to seal fourth LEDs 54 in fourth series connected body 54L collectively. It should be noted that third LEDs 53 are included in two element strings, and fourth LEDs 54 are included in two element strings. Third sealing member 63 and fourth sealing member 64 are each divided into two in correspondence with the element strings.

Sealing members 60 are disposed in parallel to the straight portions of intermediate lines 30. The longitudinal direction of sealing members 60 and the longitudinal direction of intermediate lines 30 are in the same direction. Specifically, first sealing member 61, second sealing member 62, third sealing member 63, and fourth sealing member 64 are disposed in parallel to first intermediate line 31, second intermediate line 32, and third intermediate line 33.

As illustrated in FIG. 2A, first sealing member 61 and second sealing member 62 are disposed between adjacent intermediate lines 30. Specifically, first sealing member 61 is disposed between first intermediate line 31 and second intermediate line 32. Second sealing member 62 is disposed between first intermediate line 31 and third intermediate line 33.

As illustrated in FIG. 3B, sealing members 60 each have a lateral side portion covering a lateral side portion of the straight portion of intermediate line 30. Specifically, a lateral side portion of first sealing member 61 is above a lateral side portion of the straight portion of first intermediate line 31, whereas the other lateral side portion of first sealing member 61 is above a lateral side portion of the straight portion of second intermediate line 32. In addition, a lateral side portion of second sealing member 62 is above the other lateral side portion of the straight portion of first intermediate line 31, whereas the other lateral side portion of second sealing member 62 is above a lateral side portion of the straight portion of third intermediate line 33.

It should be noted that sealing members 60 corresponding in number to the element strings of LEDs 50 are disposed, and six sealing members 60 are disposed. The length of sealing members 60 is adjusted so that sealing members 60 are within circular light emitting area E. It should be noted that the plan view shape formed by sealing members 60 as a whole is not limited to a circle. Sealing members 60 may be disposed in accordance with the shape of light emitting area E. For example, if light emitting area E is rectangular, sealing members 60 may be disposed to achieve a rectangular shape as a whole.

Here, sealing members 60 (first sealing member 61, second sealing member 62, third sealing member 63, and fourth sealing member 64) mainly include light transmitting material. If the wavelength of light from LEDs 50 is converted into a predetermined wavelength, a wavelength conversion material may be included in sealing members 60 (light transmitting material). In this case, sealing members 60 include a phosphor as a wavelength conversion material, and function as wavelength conversion members which convert the wavelength (color) of light emitted by LEDs 50. Such sealing members 60 may include an insulating resin material which contains fluorescent particles (phosphor containing resin), for example. Fluorescent particles are excited by light emitted from LEDs 50, and emit light having a desired color (wavelength).

An example of a resin material used for sealing members 60 is a silicone resin. Light diffusion material may be dispersed in sealing members 60. It should be noted that as sealing members 60, inorganic material such as low-melting glass and sol-gel glass can be used, other than organic material such as fluororesin. Particles such as silica particles can be used as light diffusion material.

In addition, as a phosphor to be contained in sealing members 60, for example, a YAG (yttrium aluminum garnet) based yellow phosphor can be used to obtain white light when LEDs 50 are blue LED chips which emit blue light. In this manner, blue light emitted by LEDs 50 is partially converted into light having a yellow light wavelength due to a yellow phosphor contained in sealing members 60. Then, blue light not absorbed by the yellow phosphor and yellow light whose wavelength has been changed by the yellow phosphor are mixed in sealing members 60 so as to exit from sealing members 60 as white light.

Sealing members 60 are achieved using a phosphor containing resin obtained by dispersing a predetermined yellow phosphor in a silicone resin. Such a phosphor containing resin is applied onto the main surface of substrate 10 using a dispenser so as to seal LEDs 50 collectively for each element string and thereafter cured, thus forming sealing members 60. Sealing members 60 applied and formed in this manner are semi-cylindrical, and the cross section perpendicular to the longitudinal direction of sealing members 60 is, for example, substantially semicircle, as illustrated in FIG. 3B.

Sealing members 60 are formed linearly along the element strings as described above, thus making the cross-sectional shape of sealing members 60 substantially semi-circular. In this manner, compared with the case where all LEDs 50 on substrate 10 are collectively sealed (the resin material is applied all over), light extraction efficiency and heat dissipation characteristics can be improved.

[Wires]

Adjacent LEDs 50, LED 50 and supply line 20, and LED 50 and relay line 25 are connected via wires 70. Gold wires, for example, can be used as wires 70.

In addition, wires 70 in sealing members 60 extend in the same direction as the longitudinal direction of sealing members 60. All wires 70 that connect LEDs 50 in each of the element strings are disposed so as to be located on the same straight line in plan view. It should be noted that wires 70 may be embedded in sealing members 60 so as not to be exposed from sealing members 60.

[Selection of Series and/or Parallel Connection of LEDs]

According to mounting substrate 1 and light emitting device 2, connecting supply lines 20 to either LEDs 50 or intermediate lines 30 via wires 70 allows selection of parallel and/or series connection of groups of all LEDs 50 on substrate 10. A description is given of this point with reference to FIGS. 4A, 4B, 5A, and 5B, in addition to FIGS. 2A and 2B.

Figure 4A:
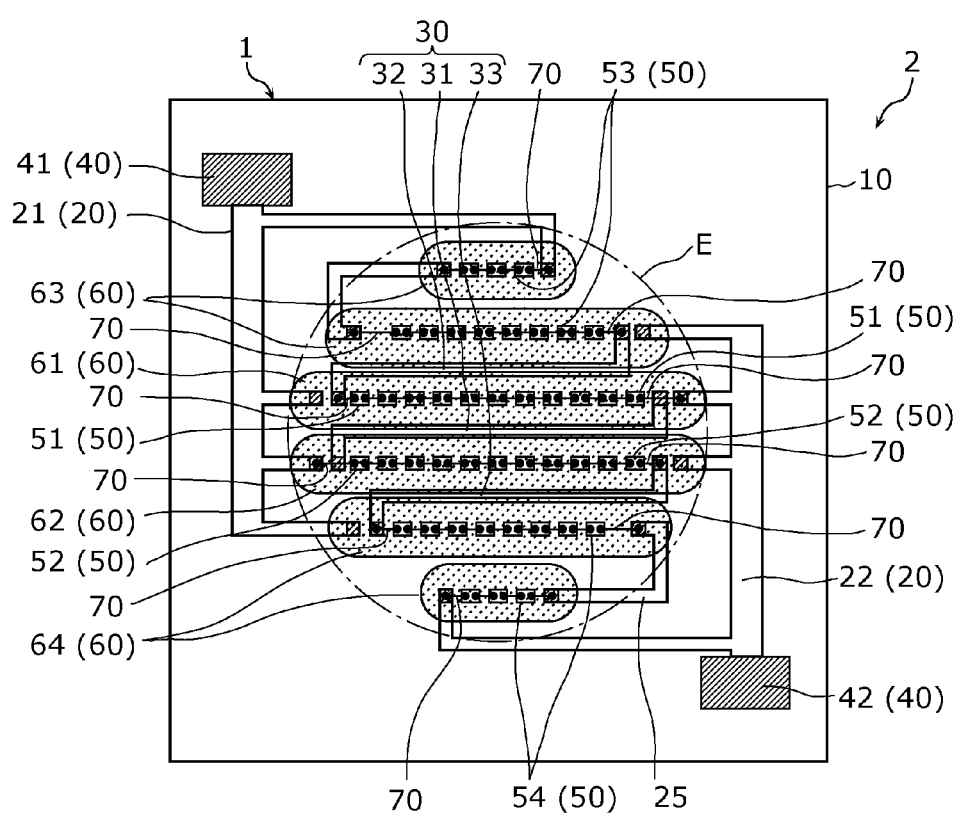
FIG. 4A is a plan view of the light emitting device according to the first exemplary embodiment when 2 parallel strings of 22 LEDs in series (22S2P) are connected to the mounting substrate in FIG. 1.
Figure 4B:
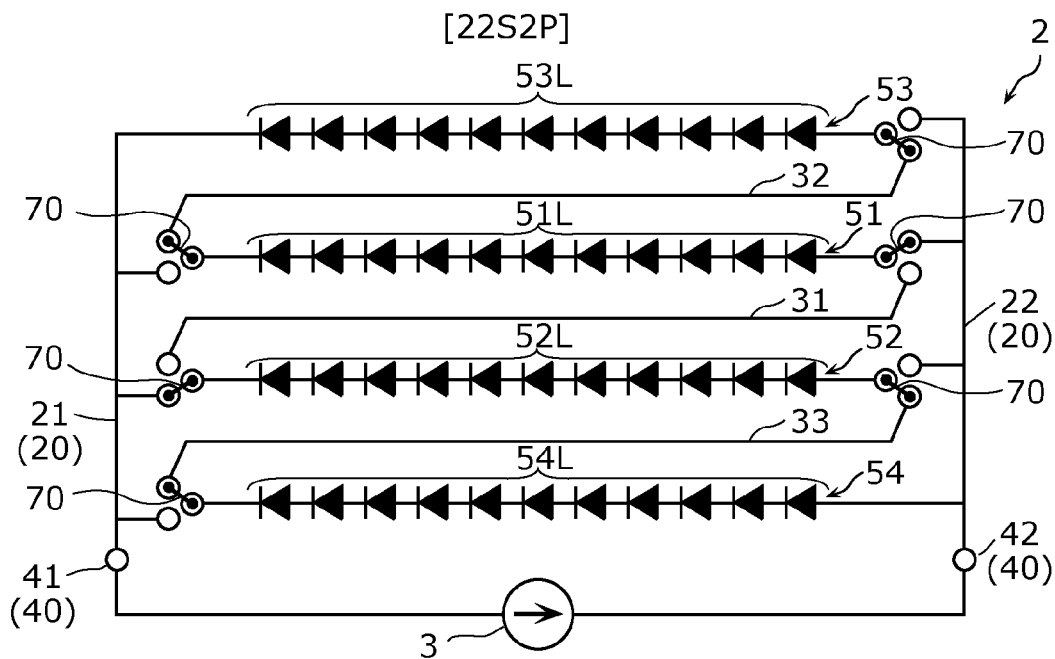
FIG. 4B is an electric diagram of the light emitting device according to the first exemplary embodiment when 2 parallel strings of 22 LEDs in series (22S2P) are connected to the mounting substrate in FIG. 1.
Figure 5A:
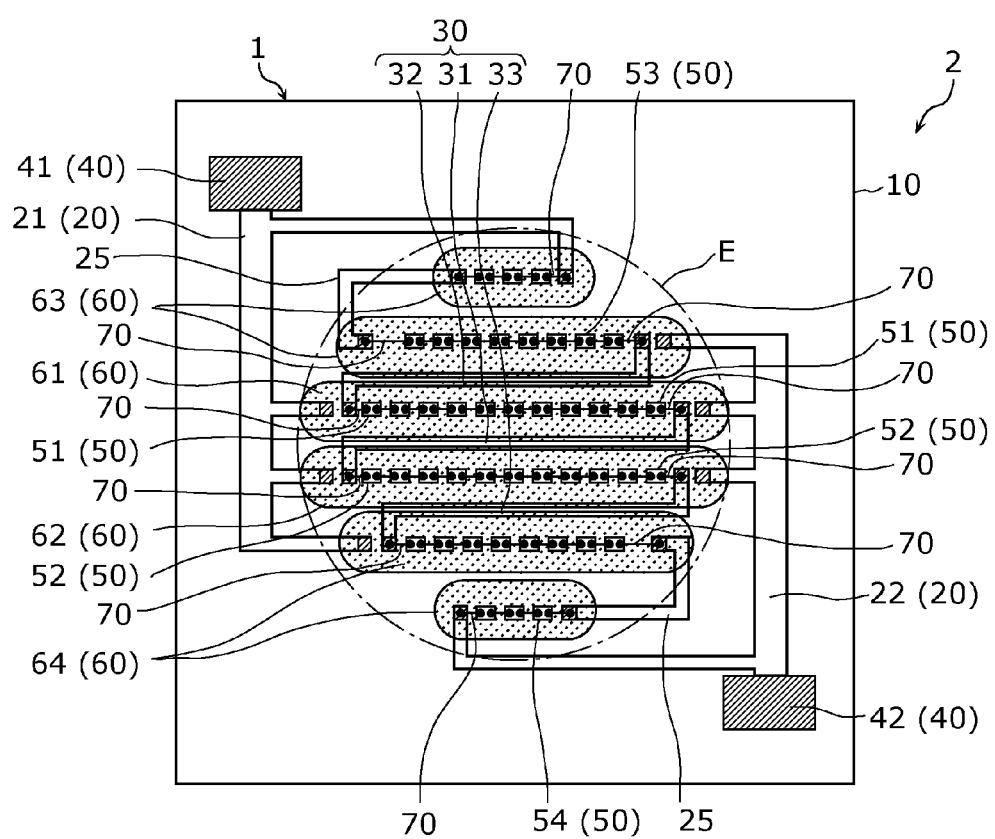
FIG. 5A is a plan view of the light emitting device according to the first exemplary embodiment when 1 parallel string of 44 LEDs in series (44S1P) is connected to the mounting substrate in FIG. 1.
Figure 5B:
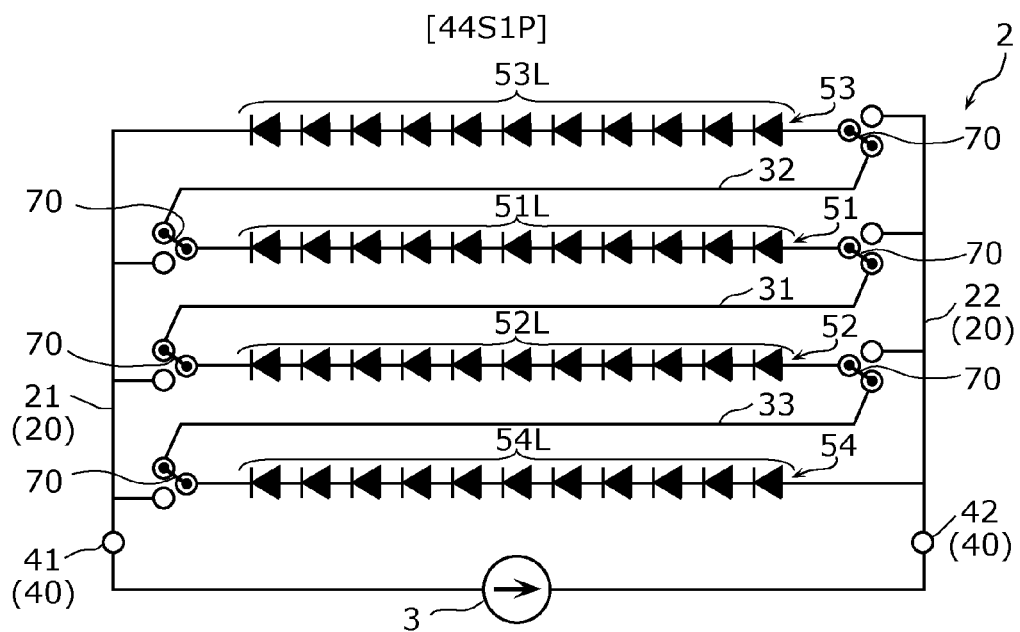
FIG. 5B is an electric diagram of the light emitting device according to the first exemplary embodiment when 1 parallel string of 44 LEDs in series (44S1P) is connected to the mounting substrate in FIG. 1.

FIGS. 4A and 4B are respectively a plan view and an electric diagram of light emitting device 2 which includes 2 parallel strings of 22 LEDs in series (22S2P). FIGS. 5A and 5B are respectively a plan view and an electric diagram of light emitting device 2 which includes 1 parallel string of 44 LEDs in series (44S1P).

For example, when 44 LEDs 50 include 4 parallel strings of 11 LEDs in series (11S4P), wires 70 are connected as illustrated in FIGS. 2A and 2B.

Specifically, four connection pads 20a of first supply line 21 and LEDs 50 at the leading ends of the four series connected bodies are all connected via wires 70. In addition, four connection pads 20a of second supply line 22 and LEDs 50 at the tail ends of the four series connected bodies are all connected via wires 70.

In other words, no intermediate lines 30 are connected to LEDs 50 and supply lines 20 in the case of 4 parallel strings of 11 LEDs in series. In this case, as illustrated in FIGS. 2A and 3A, wires 70 connect LEDs 50 and connection pads 20a, over intermediate lines 30 (connection pads 30a). It should be noted that as illustrated in FIG. 3A, insulating sealing member 60 exists between wire 70 and intermediate line 30 (connection pad 30a), which prevents wire 70 and intermediate line 30 (connection pad 30a) from short-circuiting.

In addition, when 44 LEDs 50 include 2 parallel strings of 22 LEDs in series (22S2P), wires 70 are connected as illustrated in FIGS. 4A and 4B. Specifically, wires 70 are connected as follows.

First, two of four connection pads 20a of first supply line 21 are connected to second LED 52 at the leading end of second series connected body 52L and third LED 53 at the leading end of third series connected body 53L, via wires 70.

Furthermore, two of four connection pads 20a of second supply line 22 are connected to first LED 51 at the tail end of first series connected body 51L and fourth LED 54 at the tail end of fourth series connected body 54L, via wires 70.

Furthermore, one end portion (left end portion) of second intermediate line 32 and first LED 51 at the leading end of first series connected body 51L are connected via wire 70. In addition, the other end portion (right end portion) of second intermediate line 32 and third LED 53 at the tail end of third series connected body 53L are connected via wire 70.

Furthermore, an end portion (left end portion) of third intermediate line 33 and fourth LED 54 at the leading end of fourth series connected body 54L are connected via wire 70. In addition, the other end portion (right end portion) of third intermediate line 33 and second LED 52 at the tail end of second series connected body 52L are connected via wire 70.

When 44 LEDs 50 include 1 parallel string of 44 LEDs in series (44S1P), wires 70 are connected as illustrated in FIGS. 5A and 5B. Specifically, wires 70 are connected as follows.

First, one of four connection pads 20a of first supply line 21 and third LED 53 at the leading end of third series connected body 53L are connected via wire 70.

Furthermore, one of four connection pads 20a of second supply line 22 and fourth LED 54 at the tail end of fourth series connected body 54L are connected via wire 70.

Furthermore, an end portion (left end portion) of first intermediate line 31 and second LED 52 at the leading end of second series connected body 52L are connected via wire 70, and also the other end portion (right end portion) of first intermediate line 31 and first LED 51 at the tail end of first series connected body 51L are connected via wire 70.

Furthermore, an end portion (left end portion) of second intermediate line 32 and first LED 51 at the leading end of first series connected body 51L are connected via wire 70, and also the other end portion (right end portion) of second intermediate line 32 and third LED 53 at the tail end of third series connected body 53L are connected via wire 70.

Furthermore, an end portion (left end portion) of third intermediate line 33 and fourth LED 54 at the leading end of fourth series connected body 54L are connected via wire 70, and also the other end portion (right end portion) of third intermediate line 33 and second LED 52 at the tail end of second series connected body 52L are connected via wire 70.

[Method for Manufacturing Light Emitting Device]

The following describes a method for manufacturing light emitting device 2 according to the first exemplary embodiment of the present disclosure.

First, as illustrated in FIG. 1, mounting substrate 1 is prepared which is obtained by disposing supply lines 20 and intermediate lines 30 in predetermined shapes and supply terminals 40 above substrate 10. It should be noted that relay lines 25 are also disposed above substrate 10.

Next, 44 LEDs 50 are mounted at LED mounting positions 50a on mounting substrate 1.

Next, according to a certain specification, a selection is made as to what series and parallel connection is adopted for LEDs 50 mounted on substrate 10. LEDs 50, supply lines 20, and intermediate lines 30 are wire-bonded using wires 70 so as to have the selected connection relation. Specifically, selection is made from 4 parallel strings of 11 LEDs in series (FIGS. 2A and 2B), 2 parallel strings of 22 LEDs in series (FIGS. 4A and 4B), and 1 parallel string of 44 LEDs in series (FIGS. 5A and 5B), and LEDs and lines are wire-bonded.

Next, linear sealing members 60 are disposed so as to seal LEDs 50 and wires 70 for each element string of LEDs 50. In this manner, light emitting device 2 can be manufactured.

[Operations and Effects Resulting from Present Disclosure]

The following describes operations and effects resulting from mounting substrate 1 and light emitting device 2.

For example, specifications of light emitting devices (LED modules) such as allowable operating voltage vary according to a destination (such as a foreign country), usage (product), regulation, standard, and others. Thus, there are demands for variations of a substrate size, a line pattern, the disposition and connection of LEDs (series/parallel connection), and others according to specifications. Manufacturing substrates, which are components of light emitting devices, in wide varieties in small amounts raises the cost of the light emitting devices.

For example, it is possible to enlarge a substrate in order to increase the flexibility of disposition of LEDs and line pattern layout. However, there has been a demand for smaller light emitting devices, and thus the size of a substrate cannot be simply increased.

In view of the above, disclosed is mounting substrate 1 which includes an intermediate line in a light emitting area of a substrate, and light emitting device 2 which includes mounting substrate 1, the intermediate line allowing selection of connection relation (series connection and/or parallel connection) of a plurality of LEDs on the same substrate. In this manner, light emitting devices 2 having different specifications can be manufactured using the same substrates.

According to mounting substrate 1 and light emitting device 2, LEDs 50 mounted in predetermined light emitting area E of substrate 10, and intermediate lines 30 which electrically connect LEDs 50 in parallel or series selectively are included, and furthermore intermediate lines 30 are disposed in predetermined light emitting area E.

This allows making a selection as to whether groups of LEDs 50 mounted on substrate 10 are to be connected in series or parallel or in both series and parallel. Furthermore, intermediate lines 30 are disposed in light emitting area E, and thus the substrate size can be decreased. Accordingly, small mounting substrate 1 which allows selection of series and/or parallel connection of groups of LEDs 50, and small light emitting device 2 can be achieved using the same substrate 10.

Furthermore, according to light emitting device 2, electrical connection of groups of LEDs 50 can be selected to be parallel and/or in series, even after LEDs 50 are mounted. Specifically, parallel and/or series connection can be selected depending on where wire 70 provides a bridge, and thus it is not necessary to change the orientation (mounting direction) of LEDs 50 in plan view. Therefore, parallel and/or series connection can be selected with ease.

Light-emitting device 2 further includes a plurality of series connected bodies in each of which some of LEDs 50 are connected in series. This allows selection as to whether electrical connection of the series connected bodies to be parallel and/or in series, to manufacture light emitting device 2.

Light-emitting device 2 has a plurality of element strings each having linearly disposed LEDs 50. Intermediate line 30 has a straight portion linearly disposed between two adjacent element strings. This allows intermediate line 30 to be disposed between the element strings of LEDs 50, which achieves smaller mounting substrate 1 and smaller light emitting device 2.

In light emitting device 2, LEDs 50 in each of the element strings are collectively sealed by sealing member 60. This simplifies a manufacturing process, compared to the case where LEDs 50 are individually sealed. In addition, light extraction efficiency can be improved, compared to the case where LEDs 50 on substrate 10 are entirely sealed in one. Furthermore, sealing members 60 seal LEDs 50, thus protecting LEDs 50.

In light emitting device 2, sealing member 60 is disposed in parallel to the straight portion of intermediate line 30. Accordingly, when sealing member 60 is formed on substrate 10, a lateral side portion of sealing member 60 is dammed up due to the dam effects of the straight portion of intermediate line 30. Accordingly, even if a space between adjacent sealing members 60 is small, such adjacent sealing members 60 are prevented from coming into contact with each other, and thus a light emitting device having desired light distribution characteristics can be achieved.

Sealing member 60 is disposed between the straight portions of adjacent intermediate lines 30. Accordingly, when sealing member 60 is formed on substrate 10, not only one lateral side portion of sealing member 60, but both lateral side portions of sealing member 60 can be dammed up by the dam effects of the straight portions of intermediate lines 30.

Figure 6A:
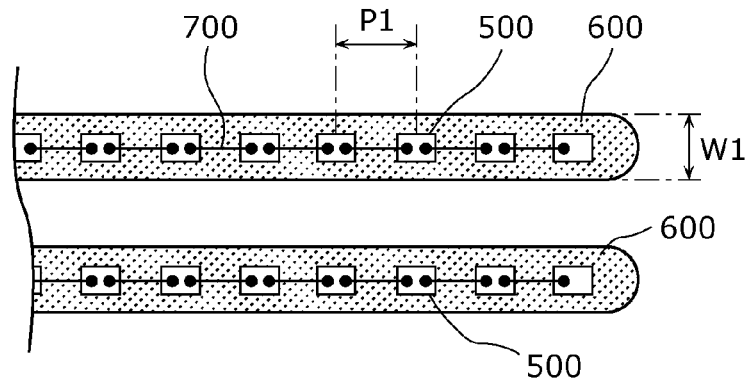
FIG. 6A illustrates a configuration of LEDs and sealing members in a light emitting device according to a first comparative example.
Figure 6B:
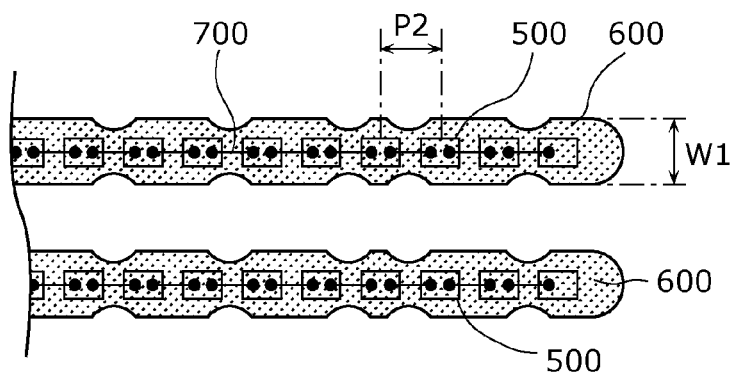
FIG. 6B illustrates a configuration of LEDs and sealing members in a light emitting device according to a second comparative example.
Figure 6C:
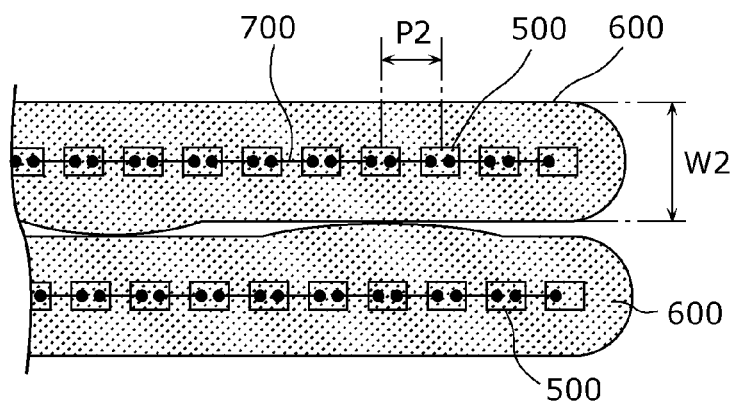
FIG. 6C illustrates a configuration of LEDs and sealing members in a light emitting device according to a third comparative example.

The following describes in detail the dam effects of intermediate line 30 with reference to FIGS. 6A to 6C. FIGS. 6A to 6C illustrate configurations of LEDs and sealing members in light emitting devices according to first to third comparative examples.

A light emitting device may be used in, for instance, an illuminator in combination with an optical member such as a lens. In this case, a light emitting area (light emitting portion) in the light emitting device may be small, due to the relation with the optical member. Accordingly, intervals at which LEDs are mounted are increasingly narrowed.

In addition, there are demands for light emitting devices to achieve higher luminous flux, in addition to size reduction while an increasing number of LEDs are mounted on a substrate. In this case, an increase in the number of mounted LEDs in order to increase luminous flux of a light emitting device narrows the intervals at which LEDs are mounted.

For example, in the light emitting device as illustrated in FIG. 6A, intervals (P1) at which LEDs 500 are mounted are narrowed without changing width W1 of sealing member 600. Then, as illustrated in FIG. 6B, recesses are generated in lateral portions of sealing members 600, which deforms sealing members 600 and deteriorates light distribution characteristics.

This is because if the intervals at which LEDs 500 are mounted are decreased (P2<P1), portions of sealing members 600 near wires 700 are narrower. Specifically, thixotropy (viscosity) of sealing members 600 (resin) makes it difficult for sealing members 600 (resin) to drop below wires 700.

For example, when width W1 (linewidth) of sealing members 600 is set to 1.65 mm, if the intervals (P2) at which LEDs 500 are mounted is 0.8 mm, and then sealing members 600 are formed, recesses are generated in lateral portions of sealing members 600.

Then, the width of sealing members 600 for LEDs 500 mounted at small intervals (P2) is increased (W2>W1), as illustrated in FIG. 6C. In this case, although recesses in the lateral portions of sealing members 600 are not generated, adjacent sealing members 600 come excessively near. Thus, light distribution characteristics deteriorate. Furthermore, as a result of adjacent sealing members 600 coming excessively near, sealing members 600 partially come into contact as illustrated in FIG. 6C, which significantly deteriorates light distribution characteristics.

In contrast, in light emitting device 2, sealing members 60 are disposed in parallel to the straight portions of intermediate lines 30. Accordingly, when sealing members 60 are formed on substrate 10, sealing members 60 are dammed up due to dam effects achieved by the height (thickness) of the straight portions of intermediate lines 30. Specifically, spread of sealing members 60 when sealing members 60 are to be formed can be restricted by intermediate lines 30. As a result, the contact of adjacent sealing members 60 can be inhibited, and thus favorable light distribution characteristics of a light emitting device can be achieved.

It should be noted that as illustrated in FIG. 3B, as a result of sealing members 60 being dammed up by intermediate lines 30, lateral side portions of sealing members 60 are above lateral side portions of the straight portions of intermediate lines 30. In this manner, according to light emitting device 2, sealing members 60 having a desired shape can be disposed using intermediate lines 30 disposed in light emitting area E.

In addition, the straight portions of intermediate lines 30 are covered with insulating film 80 in light emitting device 2, as illustrated in FIG. 3B. Specifically, insulating film 80 is disposed on the upper and lateral surfaces of the straight portions of intermediate lines 30, whereas insulating film 80 is not disposed on the surface of substrate 10. Accordingly, the height of intermediate lines 30 from the surface of substrate 10 can be further increased due to the thickness of insulating film 80. Consequently, the dam effects mentioned above can be improved. Thus, intermediate lines 30 can dam up sealing members 60 still more reliably. Furthermore, covering intermediate lines 30 with insulating film 80 improves insulating properties (dielectric strength voltage) of substrate 10, and also inhibits deterioration of intermediate lines 30.

In addition, a wavelength conversion material is included in sealing members 60 which seal LEDs 50 in light emitting device 2. This allows the wavelength of light emitted by LEDs 50 to be converted into a desired wavelength, and thus the color of light which exists from sealing members 60 can be made a desired one. It should be noted that white light exits from sealing members 60.

In addition, in light emitting device 2, an end portion of intermediate line 30 can be connected to LED 50 at the leading or tail end in an element string, and the other end portion can be connected to LED 50 at the tail or leading end in another element string. Specifically, intermediate line 30 is configured to be connectable to LED 50 at a leading end of a series connected body, and further configured to be connectable to LED 50 at the tail end of another series connected body, as illustrated in FIG. 1. Accordingly, intermediate line 30 is disposed such that a straight portion thereof is disposed between adjacent sealing members 60 (element strings). Thus, the above-mentioned dam effects of intermediate lines 30 can be exerted.

In light emitting device 2, connection pad 30a at an end portion of intermediate line 30 is disposed between connection pad 20a of supply line 20 and LED 50 at the leading or tail end of an element string. In this manner, when connection pad 20a of supply line 20 and LED 50 are connected via wire 70, or when connection pad 20a of supply line 20 and connection pad 30a of intermediate line 30 are connected via wire 70, wires 70 can extend in the same direction. This allows selection with ease of series and/or parallel connection achieved using a wire bonding machine.

In light emitting device 2, adjacent LEDs 50 are connected via wire 70. Specifically, LEDs 50 are connected by chip-to-chip. In this manner, LEDs 50 can be highly integrated with ease, and thus the size of a light emitting device can be decreased.

In light emitting device 2, LEDs 50 in different element strings are disposed in the same orientation in plan view. This allows LEDs 50 to be oriented in the same direction, and thus even when a large number of LEDs 50 are to be mounted, it takes a short time to mount the LEDs.

In light emitting device 2, a common power supply provides power to LEDs 50 on substrate 10. In this manner, even when light emitting device 2 is connected to a power supply which provides a different current in accordance with a specification, selecting series and/or parallel connection in advance allows the same mounting substrate 1 to be compatible with a power supply which provides a different current.

Figure 7:
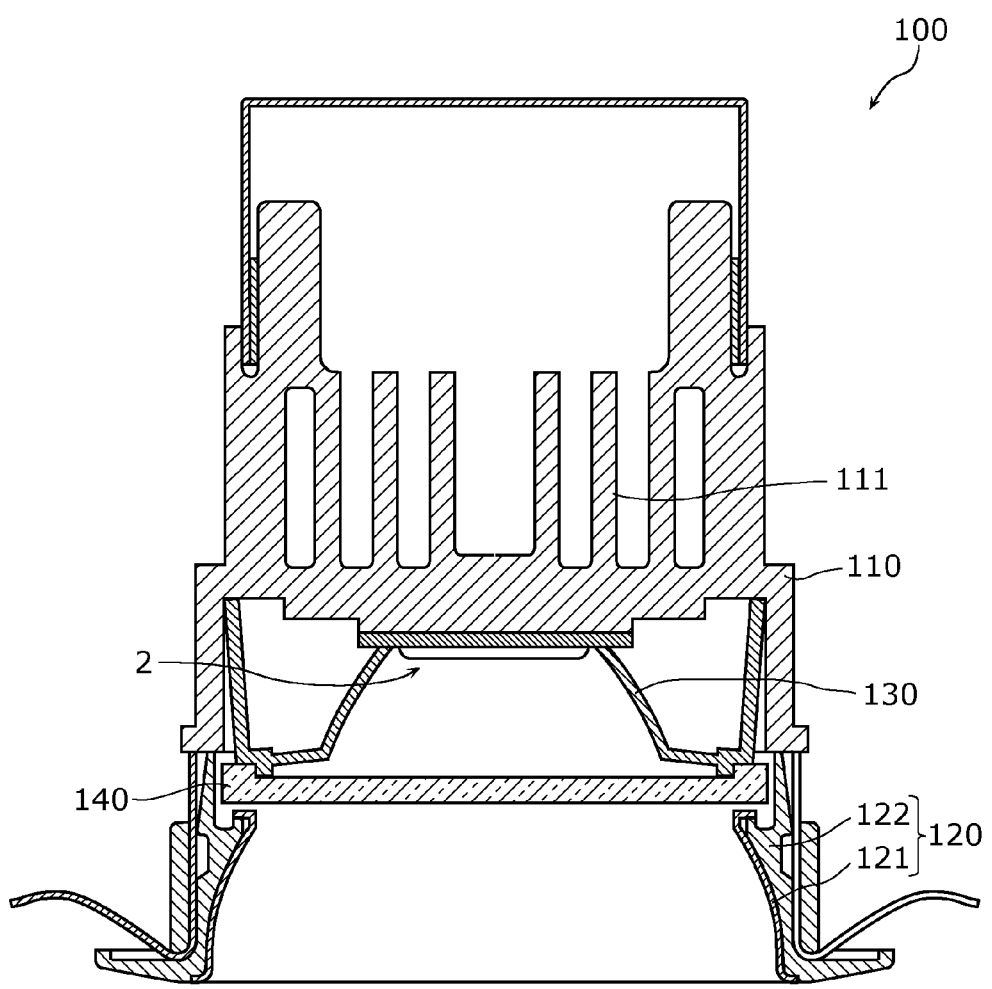
FIG. 7 is a cross-sectional view of an illumination apparatus which includes the light emitting device according to the first exemplary embodiment.
Figure 8:
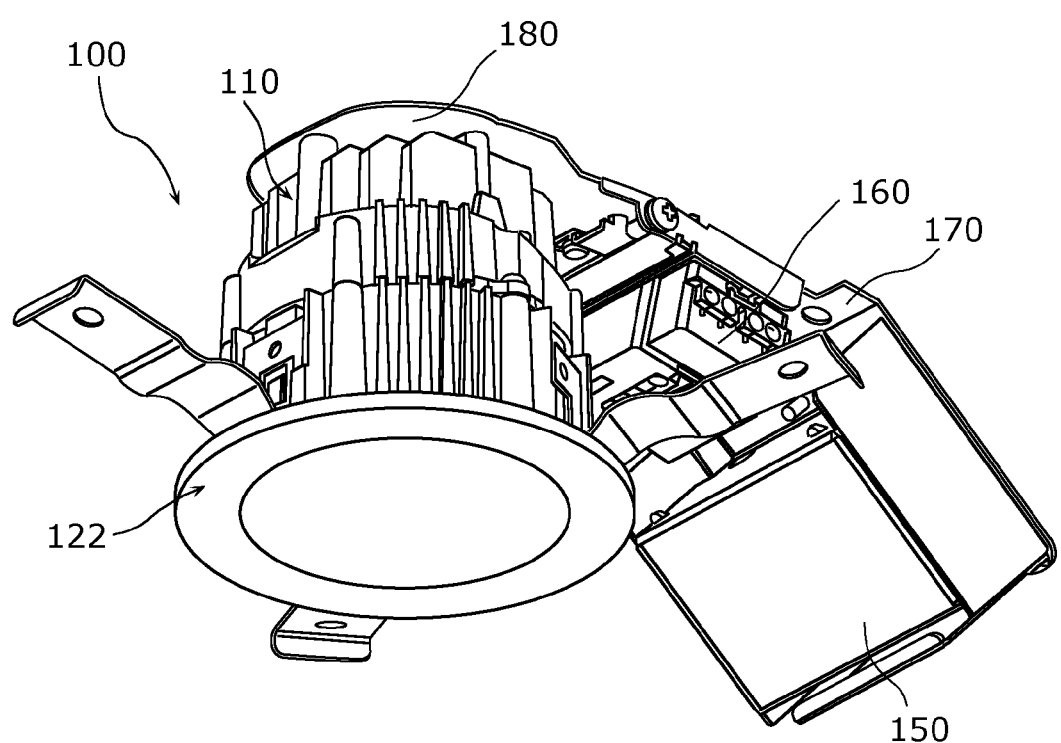
FIG. 8 is an external perspective view of the illumination apparatus illustrated in FIG. 7 and peripheral members connected to the illumination apparatus.

The following describes illumination apparatus 100 which includes light emitting device 2 according to the first exemplary embodiment of the present disclosure, with reference to FIGS. 7 and 8. FIG. 7 is a cross-sectional view of illumination apparatus 100. FIG. 8 is an external perspective view of illumination apparatus 100 and peripheral members connected to illumination apparatus 100 (lighting device and a terminal block).

As illustrated in FIGS. 7 and 8, illumination apparatus 100 is, for example, a recessed lighting fixture such as a downlight, which is installed in the ceiling of a house or the like, and emits light downward (toward a hallway, a wall, and others). Illumination apparatus 100 includes: light emitting device 2 described above; base 110 to which light emitting device 2 is attached; a substantially cylindrical device body having a closed end, which is obtained by connecting base 110 and frame body portion 120; and reflecting plate 130 and light transmitting panel 140 which are disposed inside the device body.

Base 110 is a mount to which light emitting device 2 is attached, and also serves as a heat sink which dissipates heat generated by light emitting device 2. Base 110 is formed to have a substantially cylindrical shape using a metal material, and made by aluminum die casting.

An upper portion (ceiling side portion) of base 110 includes a plurality of radiation fins 111 protruding upwards which are spaced apart at regular intervals in one direction. This allows heat generated by light emitting device 2 to efficiently dissipate.

Frame body portion 120 includes substantially cylindrical cone portion 121 having a reflective inner surface, and frame body portion 122 to which cone portion 121 is attached. Cone portion 121 is molded using a metal material, and fabricated by subjecting, for instance, an aluminum alloy to drawing or press forming, for example. Frame body portion 122 is molded using a hard resin material or a metal material. Frame body portion 120 is fixed by frame body portion 122 being attached to base 110.

Reflecting plate 130 is circular-frame shaped (funnel-shaped) reflecting member having an internal reflecting function. Reflecting plate 130 is formed, for example, using a metal material such as aluminum. It should be noted that reflecting plate 130 may be formed using a hard white resin material, rather than a metal material.

Light transmitting panel 140 is a light transmitting member having light diffusing and light transmitting properties. Light transmitting panel 140 is a flat plate disposed between reflecting plate 130 and frame body portion 120, and is attached to reflecting plate 130. Light transmitting panel 140 is formed disc-like, using, for example, a transparent resin material such as acrylics and polycarbonate.

It should be noted that light transmitting panel 140 may not be included. A configuration without light transmitting panel 140 can increase luminous flux of an illumination apparatus.

In addition, as illustrated in FIG. 8, lighting device 150 which supplies light emitting device 2 with light emission power, and terminal block 160 which relays alternating current power from a commercial power supply to lighting device 150 are connected to illumination apparatus 100.

Lighting device 150 and terminal block 160 are attached to attachment plate 170 provided separately from a device body. Attachment plate 170 is obtained by bending a rectangular plate-shaped member made of a metal material. Lighting device 150 is attached and fixed onto an undersurface of a longitudinal end portion of attachment plate 170, and terminal block 160 is attached and fixed onto the undersurface of the other end portion. Attachment plate 170 is connected to top plate 180 attached and fixed onto the upper portion of base 110 of the device body.

It should be noted that although the above is a description of illumination apparatus 100 which includes light emitting device 2, later-described light emitting device 2A according to a second exemplary embodiment may be used, instead of light emitting device 2.

Second Exemplary Embodiment

The following describes mounting substrate 1A and light emitting device 2A according to a second exemplary embodiment of the present disclosure, with reference to FIGS. 9, 10A, 10B, 11A, and 11B.

Figure 9:
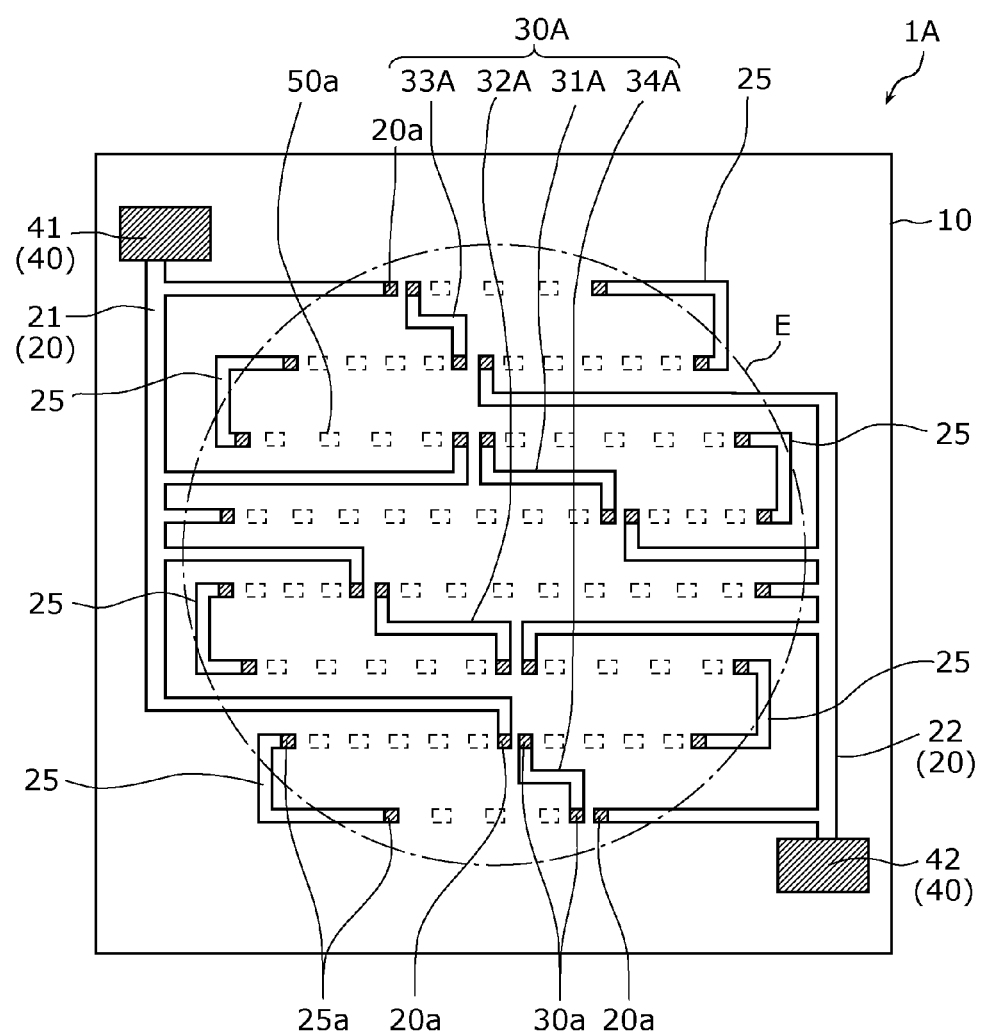
FIG. 9 is a plan view of a mounting substrate according to a second exemplary embodiment.
Figure 10A:
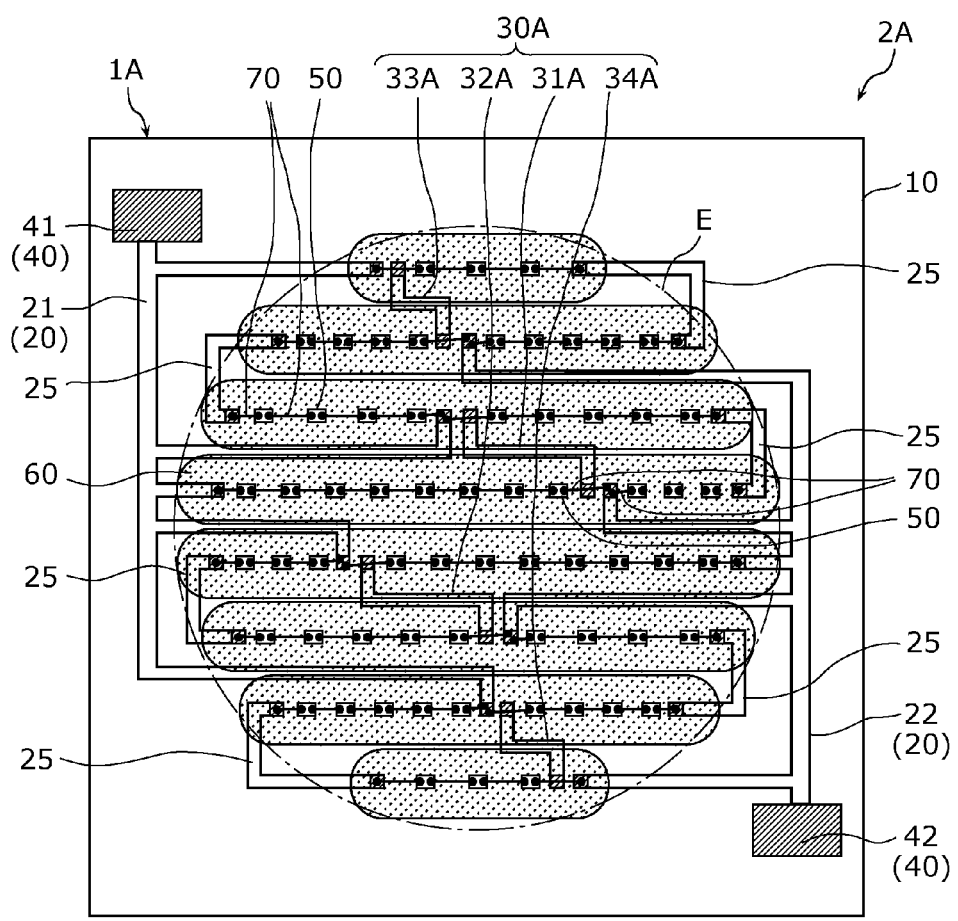
FIG. 10A is a plan view of a light emitting device according to the second exemplary embodiment when 8 parallel strings of 8 LEDs in series (8S8P) are connected to the mounting substrate in FIG. 9.
Figure 10B:
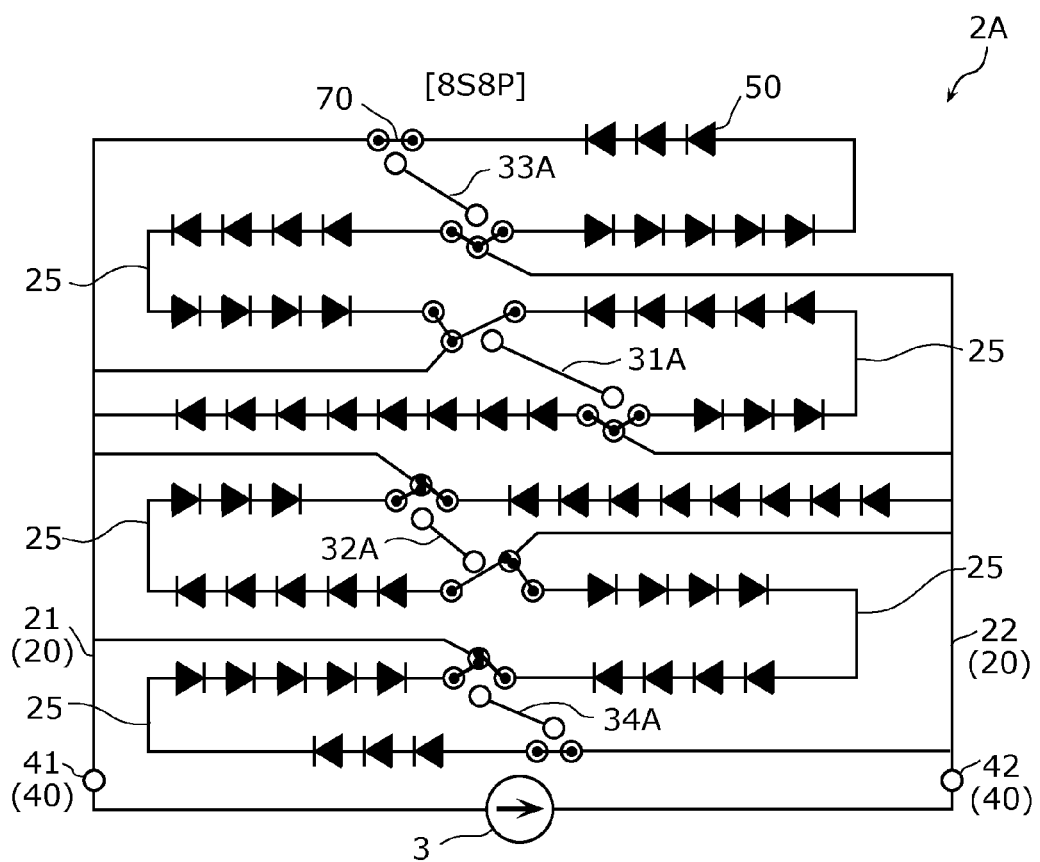
FIG. 10B is an electric diagram of the light emitting device according to the second exemplary embodiment when 8 parallel strings of 8 LEDs in series (8S8P) are connected to the mounting substrate in FIG. 9.
Figure 11A:
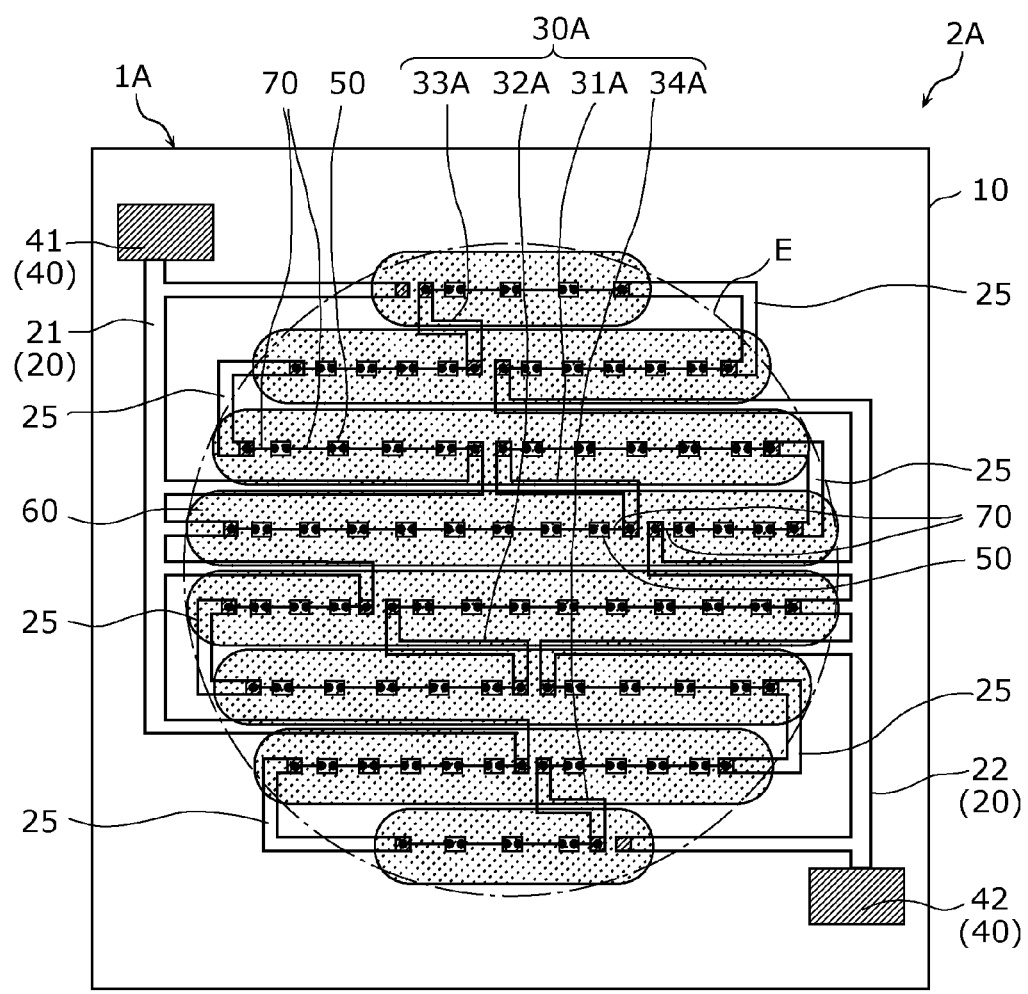
FIG. 11A is a plan view of the light emitting device according to the second exemplary embodiment when 4 parallel strings of 16 LEDs in series (16S4P) are connected to the mounting substrate in FIG. 9.
Figure 11B:
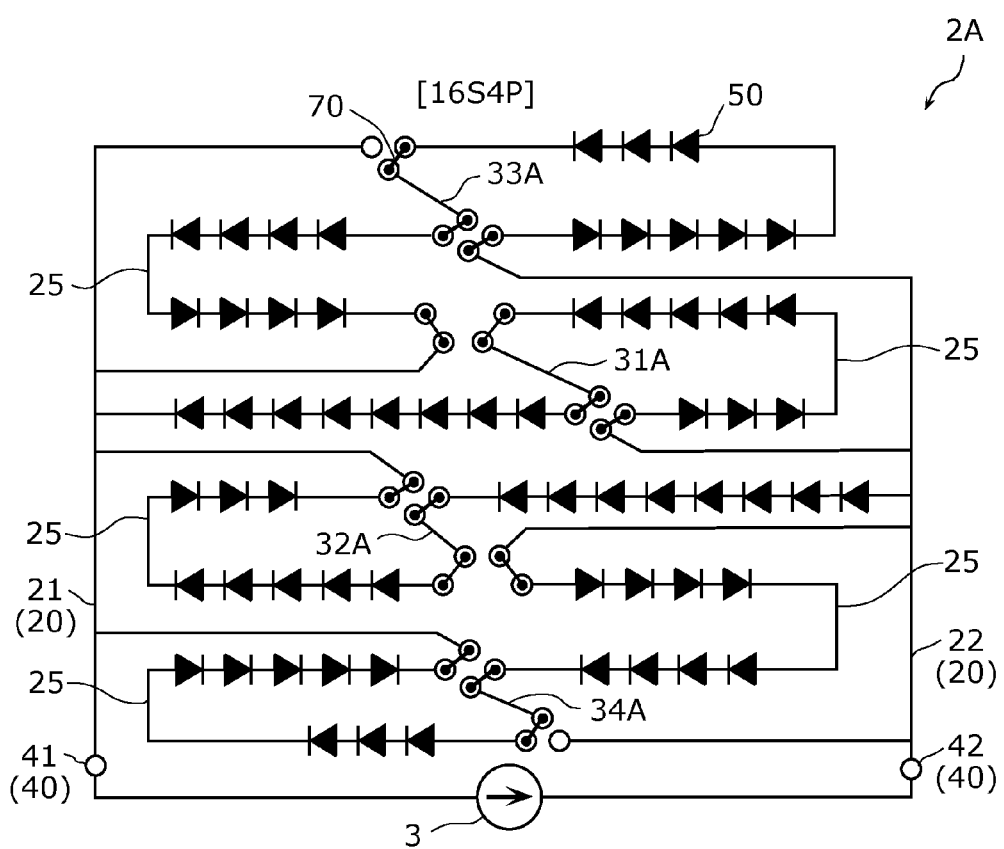
FIG. 11B is an electric diagram of the light emitting device according to the second exemplary embodiment when 4 parallel strings of 16 LEDs in series (16S4P) are connected to the mounting substrate in FIG. 9.

FIG. 9 is a plan view of mounting substrate 1A. FIGS. 10A and 10B are respectively a plan view and an electric diagram of light emitting device 2A which includes 8 parallel strings of 8 LEDs in series. FIGS. 11A and 11B are respectively a plan view and an electric diagram of light emitting device 2A which includes 4 parallel strings of 16 LEDs in series.

As illustrated in FIG. 9, mounting substrate 1A has a plurality of LEDs 50 mounted in predetermined light emitting area E, as with mounting substrate 1 according to the first exemplary embodiment. Mounting substrate 1A includes substrate 10, supply lines 20, intermediate lines 30A, relay lines 25, and supply terminals 40.

In addition, as illustrated in FIG. 10A, light emitting device 2A includes substrate 10, supply lines 20, intermediate lines 30A, LEDs 50, relay lines 25, supply terminals 40, sealing members 60, and wires 70, as with light emitting device 2 according to the first exemplary embodiment.

64 LEDs 50 are used for light emitting device 2A, and intermediate lines 30A allow selection of electrical series and/or parallel connection of groups of 64 LEDs 50.

Accordingly, a line pattern shape of supply lines 20, intermediate lines 30A, and relay lines 25 is different from that of light emitting device 2. Intermediate lines 30A include four lines, namely, first intermediate line 31A, second intermediate line 32A, third intermediate line 33A, and fourth intermediate line 34A. Furthermore, among eight series connected bodies, six series connected bodies are each divided into two element strings, and thus six relay lines 25 are disposed.

With regard to mounting substrate 1A also, intermediate lines 30A are each configured to be connectable to LED 50 at a leading end of a series connected body and further configured to be connectable to LED 50 at a tail end of another series connected body, as with mounting substrate 1 according to the first exemplary embodiment.

It should be noted that connection pad 30a of intermediate line 30 is disposed between two adjacent LEDs 50 in the same element string above mounting substrate 1A, which is a difference from mounting substrate 1.

It should be noted that substrate 10 of mounting substrate 1A is the same as that of mounting substrate 1. Specifically, a square substrate with sides having a length of 20 mm is used. Light-emitting area E is larger than that of mounting substrate 1, and is a circle having a diameter of 14.9 mm.

With mounting substrate 1A and light emitting device 2A which are configured in the above manner, depending on whether supply line 20 is connected to LED 50 via wire 70 or supply line 20 is connected to intermediate line 30A via wire 70, a selection can be made as to whether groups of all LEDs 50 on substrate 10 are electrically connected in parallel and/or series, as with the first exemplary embodiment.

For example, wires 70 may be connected as illustrated in FIGS. 10A and 10B, if 64 LEDs 50 include 8 parallel strings of 8 LEDs in series.

Wires 70 may be connected as illustrated in FIGS. 11A and 11B, if 64 LEDs 50 include 4 parallel strings of 16 LEDs in series.

As stated above, mounting substrate 1A and light emitting device 2A according to the present exemplary embodiment achieve similar effects to those achieved in the first exemplary embodiment.

It should be noted that light emitting device 2A can be manufactured using the same method as or a similar method to that in the first exemplary embodiment.

Other Variations

Although the above describes a light emitting device, an illumination apparatus, and a mounting substrate according to the present disclosure, based on the exemplary embodiments, the present disclosure is not limited to such embodiments.

Figure 12:
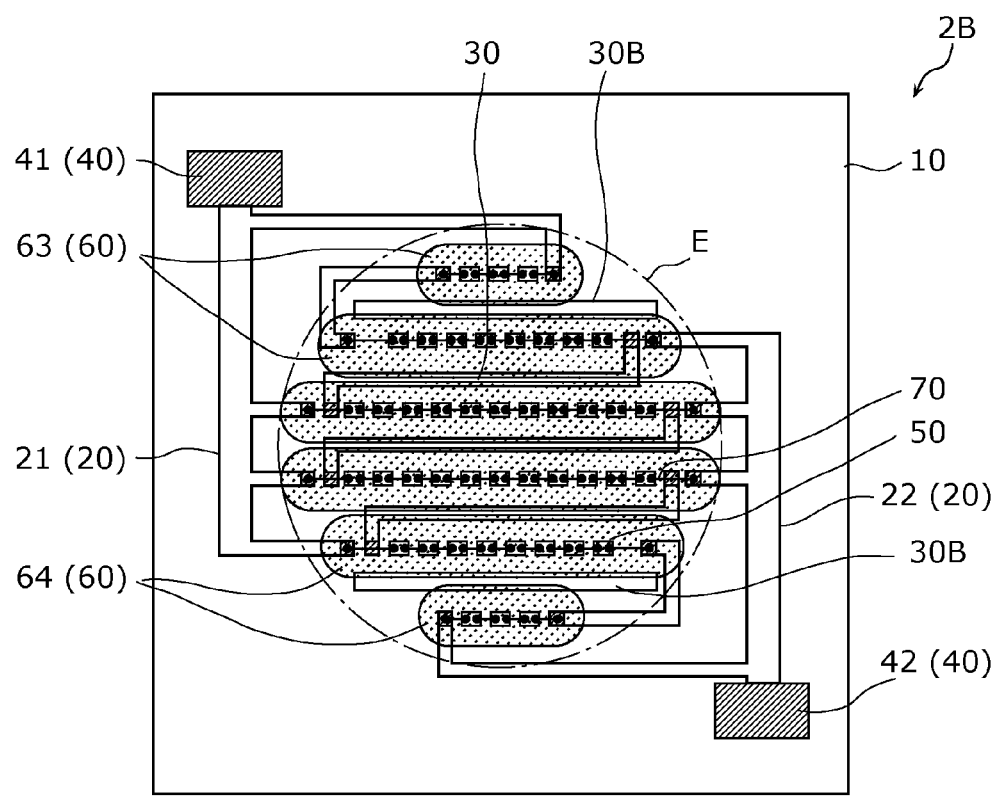
FIG. 12 is a plan view of a light emitting device according to a variation of the present disclosure.

For example, as illustrated in FIG. 12, linear dummy lines 30B may be each disposed between adjacent sealing members 60 where intermediate lines 30 are not present. Dummy lines 30B can be formed using the same material as that of intermediate lines 30. It should be noted that wires 70 are not connected to dummy lines 30B, and thus dummy lines 30B do not function as intermediate lines.

In this manner, linear dummy lines 30B are disposed between adjacent sealing members 60, and thus the same dam effects as those achieved by intermediate line 30 can be obtained. Specifically, when sealing members 60 are to be formed above substrate 10, a lateral side portion of sealing members 60 are dammed up by dam effects of straight portions of dummy lines 30B. Thus, even in a portion where intermediate line 30 is not present, adjacent sealing members 60 can be inhibited from being in contact with each other. Therefore, a light emitting device having further improved light distribution characteristics can be achieved.

In addition, although a light emitting device (LED module) includes a combination of a blue LED chip and a yellow phosphor in the exemplary embodiments above, the present disclosure is not limited to this. For example, in order to increase color rendering properties, a red phosphor and a green phosphor may be further mixed in addition to a yellow phosphor. Alternatively, a configuration may be adopted in which without using a yellow phosphor, a phosphor containing resin which contains a red phosphor and a green phosphor is used and combined with a blue LED, to allow emission of white light. Alternatively LEDs of different colors may be combined. For example, a blue LED chip and a red LED chip in combination may be mounted on substrate 10.

In the above exemplary embodiments, an LED chip which emits light in a color other than blue may be used. For example, if an ultraviolet LED chip which emits ultraviolet light having a shorter wavelength than a blue LED chip is used, a combination of color phosphors that are excited mainly by ultraviolet light and emit light having three primary colors (red, green, and blue) may be used.

Although a phosphor is used as a wavelength conversion material in the above exemplary embodiments, the present disclosure is not limited to this. For example, as a wavelength conversion material, a material which includes a substance that absorbs light having a certain wavelength and emits light having a wavelength different from the absorbed light may be used, such as a semiconductor, a metal complex, an organic dye, or a pigment.

Although a light emitting device (LED module) has a COB configuration in which LED chips are directly mounted on a substrate in the above exemplary embodiments, an SMD (surface mount device) configuration may be adopted. In this case, a configuration can be achieved in which an SMD LED element which includes: a resin container (package); an LED chip disposed in the container; and a sealing member (phosphor containing resin) disposed in the container so as to cover the LED chip is used as a light emitting element, and a plurality of such SMD LED elements are mounted on substrate 10 as LEDs 50.

Although an LED is described as an example of a light emitting element used for a light emitting device in the above exemplary embodiments, a semiconductor light emitting element such as a semiconductor laser, an EL (electro luminescence) element such as an organic EL element or an inorganic EL element, or another solid-state light emitting element may be used.

Although the above exemplary embodiments show an example in which a light emitting device is applied as a downlight, the present disclosure is not limited to this. For example, the light emitting device according to the above exemplary embodiments is applicable to other illuminators such as a spotlight and a base light (illumination apparatus), illumination light sources such as a bulb lamp and a straight tube lamp, a back light source of, for instance, a liquid crystal display, a lamp light source of, for instance, a copying machine, and light sources of, for instance, a guide light and a signboard device.

It should be noted that the scope of the present disclosure may also include embodiments achieved as a result of adding, to the exemplary embodiments, various modifications that may be conceived by those skilled in the art, and embodiments obtained by combining constituent elements in the exemplary embodiments in any manner as long as the combination does not depart from the spirit of the present disclosure.

What is claimed is:

1. A light emitting device comprising:
   a substrate;
   a plurality of first light emitting elements connected in series and mounted on the substrate;
   a plurality of second light emitting elements connected in series and mounted on the substrate;
   an intermediate line disposed above the substrate and for electrically connecting the plurality of first and second light emitting elements in parallel or series selectively;
   a pair of supply terminals disposed above the substrate;
   a first supply line electrically connected to a supply terminal of the pair of supply terminals and disposed above the substrate; and
   a second supply line electrically connected to the other supply terminal of the pair of supply terminals and disposed above the substrate, wherein:
   at least two of the plurality of first light emitting elements are linearly configured to form a first element string;

at least two of the plurality of second light emitting elements are linearly configured to form a second element string; and the intermediate line has:
an end connectable to one of the first light emitting elements at a leading end or a tail end of the first element string; and
another end connectable to one of the second light emitting elements at a tail end or a leading end of the second element string.

2. The light emitting device according to claim 1, further comprising a plurality of sealing members linearly disposed above the substrate, wherein the plurality of first light emitting elements in the first element string are collectively sealed by one of the plurality of sealing members, and the plurality of second light emitting elements in the second element string are collectively sealed by a different one of the plurality of sealing members.

3. The light emitting device according to claim 2, wherein the plurality of sealing members are disposed in parallel to the straight portion.

4. The light emitting device according to claim 3, wherein the plurality of sealing members each have a lateral side portion covering a lateral side portion of the straight portion.

5. The light emitting device according to claim 2, wherein the straight portion is covered with an insulating film.

6. The light emitting device according to claim 2, wherein the plurality of sealing members each include a wavelength conversion material.

7. The light emitting device according to claim 1, wherein the intermediate line includes, at each of the end and the another end, a first connection pad to which a wire is connected, the first supply line and the second supply line each include, at an end, a second connection pad to which a wire is connected, the first connection pad at the end of the intermediate line is disposed between the second connection pad of the first supply line and the one of the second light emitting elements at the leading end or the tail end of the second element string, and the first connection pad at the another end of the intermediate line is disposed between the second connection pad of the second supply line and the one of the first light emitting elements at the tail end or the leading end of the first element string.

8. The light emitting device according to claim 1, wherein the intermediate line includes, at an end, a first connection pad which is connected to one of the first light emitting elements or one of the second light emitting elements via a wire, and the first connection pad is disposed between an adjacent pair of the first light emitting elements or between an adjacent pair of the second light emitting elements.

9. The light emitting device according to claim 1, wherein an adjacent pair of the plurality of first light emitting elements is connected via a wire, and an adjacent pair of the plurality of second light emitting elements is connected via a wire.

10. The light emitting device according to claim 1, wherein the plurality of first light emitting elements and the plurality of second light emitting elements are disposed in a same orientation in top view.

11. The light emitting device according to claim 1, wherein a common power supply provides power to the plurality of first light emitting elements and the plurality of second light emitting elements.

12. An illumination apparatus comprising: the light emitting device according to claim 1; and a base to which the light emitting device is attached.

13. A mounting substrate comprising:
a substrate upon which a plurality of first light emitting elements connected in series and a plurality of second light emitting elements connected in series are mounted;
an intermediate line, above the substrate, for electrically connecting the first and second plurality of light emitting elements in parallel or series selectively;
a pair of supply terminals disposed above the substrate;
a first supply line electrically connected to one supply terminal of the pair of supply terminals and disposed above the substrate; and
a second supply line electrically connected to the other supply terminal of the pair of supply terminals and disposed above the substrate, wherein:
at least two of the plurality of first light emitting elements are linearly configured to form a first element string;
at least two of the plurality of second light emitting elements are linearly configured to form a second element string; and
the intermediate line has a straight portion linearly disposed between the first element string and the second element string, and has:
an end connectable to one of the first light emitting elements at a leading end or a tail end of the first element string; and
the other end connectable to one of the second light emitting elements at a tail end or a leading end of the second element string.

14. The light emitting device according to claim 1, wherein the first and second plurality of light emitting elements are mounted in a light emitting area of the substrate, and the intermediate line is disposed in the light emitting area.

15. The mounting substrate to claim 13, wherein the first and second plurality of light emitting elements are mounted in a light emitting area of the substrate, and the intermediate line is disposed in the light emitting area.

* * * * *